United States Patent
Vockic et al.

(10) Patent No.: US 8,734,681 B2
(45) Date of Patent: *May 27, 2014

(54) LUMINESCENT MATERIALS THAT EMIT LIGHT IN THE VISIBLE RANGE OR THE NEAR INFRARED RANGE AND METHODS OF FORMING THEREOF

(71) Applicant: OMNIPV, Inc., Menlo Park, CA (US)

(72) Inventors: Nemanja Vockic, San Jose, CA (US); Jian Jim Wang, Orefield, PA (US); William Pfenninger, Fremont, CA (US); John Kenney, Palo Alto, CA (US)

(73) Assignee: OMNIPV, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/855,561

(22) Filed: Apr. 2, 2013

(65) Prior Publication Data

US 2013/0214205 A1     Aug. 22, 2013

Related U.S. Application Data

(63) Continuation-in-part of application No. 12/611,062, filed on Nov. 2, 2009, which is a continuation of application No. 11/689,381, filed on Mar. 21, 2007, now Pat. No. 7,641,815, which is a continuation of application No. 12/958,825, filed on Dec. 2, 2010, now abandoned.

(60) Provisional application No. 60/784,863, filed on Mar. 21, 2006, provisional application No. 61/267,756, filed on Dec. 8, 2009.

(51) Int. Cl.
C09K 11/08     (2006.01)
C09K 11/61     (2006.01)
C09K 11/66     (2006.01)

(52) U.S. Cl.
USPC .................. 252/301.4 H; 252/301.4 F

(58) Field of Classification Search
USPC ............... 252/301.4 H, 301.4 F, 301.17; 250/486.1, 370.12, 390.11; 428/34.1
See application file for complete search history.

(56) References Cited

U.S. PATENT DOCUMENTS 2,196,077 A    4/1940    John
3,655,332 A    4/1972    Smith, Jr.

(Continued)

FOREIGN PATENT DOCUMENTS

DE    29 52 436    7/1981
DE    101 48 161    4/2003

(Continued)

OTHER PUBLICATIONS

EIC Search Report (Sep. 18, 2013).*

(Continued)

*Primary Examiner* — Emily Le
*Assistant Examiner* — Lynne Edmondson
(74) *Attorney, Agent, or Firm* — Foley & Lardner LLP; Cliff Z. Liu

(57) ABSTRACT

Luminescent materials and methods of forming such materials are described herein. In one embodiment, a luminescent material has the formula: $[A_a Sn_b X_x X'_{x'} X''_{x''}]$, where the luminescent material is polycrystalline; A is included in the luminescent material as a monovalent cation; X, X', and X" are selected from fluorine, chlorine, bromine, and iodine; a is in the range of 1 to 5; b is in the range of 1 to 3; a sum of x, x', and x" is in the range of 1 to 5; and at least X' is iodine, such that $x'/(x+x'+x'') \geq 1/5$.

39 Claims, 9 Drawing Sheets

(56) References Cited

U.S. PATENT DOCUMENTS

| | | | |
|---|---|---|---|
| 4,054,645 | A | 10/1977 | Hill et al. |
| 4,076,794 | A | 2/1978 | Smith |
| 4,769,549 | A | 9/1988 | Tsuchino et al. |
| 4,803,366 | A | 2/1989 | Vieux et al. |
| 5,318,764 | A | 6/1994 | Meshri et al. |
| 5,721,634 | A | 2/1998 | Rosker et al. |
| 5,736,069 | A | 4/1998 | Willems et al. |
| 6,228,286 | B1 | 5/2001 | Leblans et al. |
| 6,880,746 | B2 | 4/2005 | Seseke-Koyro et al. |
| 7,641,815 | B2 | 1/2010 | Varadarajan et al. |
| 2003/0042429 | A1 | 3/2003 | Isoda |
| 2003/0102099 | A1* | 6/2003 | Yadav et al. ............ 162/208 |
| 2003/0104121 | A1 | 6/2003 | Leblans et al. |
| 2003/0189401 | A1 | 10/2003 | Kido et al. |
| 2004/0065403 | A1* | 4/2004 | Hattori et al. ............ 156/230 |
| 2005/0107870 | A1 | 5/2005 | Wang et al. |
| 2005/0181119 | A1 | 8/2005 | Tahon et al. |
| 2005/0285041 | A1 | 12/2005 | Srivastava et al. |
| 2006/0169998 | A1 | 8/2006 | Radkov et al. |
| 2007/0205712 | A1 | 9/2007 | Radkov et al. |
| 2008/0014463 | A1 | 1/2008 | Varadarajan et al. |
| 2008/0038494 | A1 | 2/2008 | Midgley et al. |
| 2010/0055350 | A1 | 3/2010 | Pfenninger et al. |
| 2011/0180757 | A1 | 7/2011 | Vockic et al. |
| 2012/0305918 | A1 | 12/2012 | Shum |

FOREIGN PATENT DOCUMENTS

| | | |
|---|---|---|
| EP | 0 751 200 | 1/1997 |
| EP | 1 113 458 A1 | 7/2001 |
| EP | 1 276 117 A2 | 1/2003 |
| JP | 2008-102293 A | 4/1996 |
| WO | WO 2007/109734 | 9/2007 |

OTHER PUBLICATIONS

Donaldson et al., 'The Mossbauer Effect in Tin(II) Compounds. Part XII. Data for the Products from Molten Caesium-Tin(II)-Halide Systems', J.C.S. Dalton, 1973, pp. 666-669.*

Miller et al., 'Study of the Heterocomplexes in the Vapor of the Na—Sn—Br—I System and Their Relevance for Metal Halide Lamps', J. Electrochem. Soc., vol. 141, No. 10, Oct. 1994, pp. 2774-2778.*

Abstract, "Jahn-Teller distortion in the excited state of telluride (IV) in dicesium metal (M) hexachloride (Cs2MC16 M=zirconium,tin))." Chem. Pysic Lett. 144:5-6, pp. 460-462 (1988).

Babudri, et al., "Synthesis of Poly(arylenevinylene)s with fluorinated vinylene units", European Journal of Organic Chemistry, pp. 1977-1982, (2008).

Caricato, A.P., "Pulsed laser deposition of Pr3—doped chalogenide thin films for optical applications," Proc. SPIE, Nov. 2003, vol. 5121, No. 18, pp. 325-336.

Chabot et al. "Ab initio study of the electronic and structural properties of CsSnI3 perovskite" U. Montreal 6 pages (2003).

Clark et al., Luminescence and electrical conductivity of CsSnBr3, and related phases; Science Direct J. Physics & Chemi. of Solids, vol. 42, 3:133-135 (1981).

Donaldson et al. "The Mossbauer Effect in Tin(II) Compounds. Part XIII. Data for the Products from Molten Caesium-Tin(II)-Halide Systems" J.C.S. Dalton pp. 666-669 (1973).

European Appln. No. 07759029.7 Examination Report dated Jul. 20, 2012.

European Appln. No. 07759029.7 Examination Report dated Oct. 12, 2011.

European Appln. No. 07759029.7. Search Report dated Mar. 19, 2010.

International Search Report, Korean Intellectual Property Office, Republic of Korea, Aug. 17, 2011.

Jacobs, Alkali halide crystals containing impurity ions with the ns2 ground-state electronic configuration. J. Phys. Chem. Solids vol. 52, No. 1, pp. 35-67 (1991).

Losurdo, et al., "Impact of fluorinated vinylene units on supramolecular organization and optical properties of poly(p-phenylenedifluorovinylene) thin films as a class of blue band gap conjugated polymers", Polymer, 49: 4133-4140, (2008).

Mauersberger, "Structure of caesium triiodostannate(II)." ACTA Crystallographica (Mar. 1, 1990).

Notification of First Office Action received for Chinese Appln. No. 200780017078.2 dated Aug. 1, 2011.

Notification of Second Office Action. Chinese Appln. No. 200780017078.2 dated Aug. 2, 2012.

Parry et al. "The Electronic Structure of CsSnBr3 and Related Trihalides; Studies Using XPS and Band Theory" J. Solid State Chemistry 28, pp. 401-408 (1979).

Scaife et al., "Crystal preparation and properties of cesium tin (II) trihalides." J. Solid State Chem., vol. 9, pp. 308-314, (Mar. 1, 1974).

Shum, et al., "Synthesis and characterization of CsSnI3 thin films", Applied Physics Letters, 96: pp. 221903-1 to 221903-3, (2010).

Suib et al. "Gel growth of single crystals of some rubidium and cesium tin halides" J. Crystal Growth 48, pp. 155-160 (1980).

U.S. Appl. No. 11/689,381. Notice of Allowance dated Aug. 20, 2009.

U.S. Appl. No. 11/689,381. Office Action dated Jan. 29, 2009.

U.S. Appl. No. 11/689,381. Office Action dated Jun. 9, 2009.

U.S. Appl. No. 12/611,062. Restriction Requirement dated Jun. 27, 2012.

U.S. Appl. No. 12/611,062 Office Action dated Sep. 24, 2012.

Voloshinovskii, et al., "Luminescence and Structural Transformations of CsSnC13 Crystals," J. Applied Spectroscopy, 1994, vol. 60, Nos. 3-4, 1 page (Abstract Only).

Yamada et al. "Structural Phase Transitions of the Polymorphs of CsSnI3 by Means of Rietveld Analysis of the X-Ray Diffraction" Chemistry Letters, The Chemical Society of Japan, pp. 801-804 (1991).

Yamada et al. "Structure and Bonding of Two Modifications of CsSnI3 by Means of Powder X-Ray Diffraction, 1271 NOR, and DTA" Chern. Letters, Chem. Society of Japan, pp. 1325-1328 (1989).

Yamada et al., "I-NQR, 119Sn Mossbauer effect and electrical conductivity of MSn1d (M=K, NH4, Rb, Cs and CH3NH3)." (Jan. 1, 1990).

* cited by examiner

LUMINESCENT MATERIALS THAT EMIT LIGHT IN THE VISIBLE RANGE OR THE NEAR INFRARED RANGE AND METHODS OF FORMING THEREOF

CROSS REFERENCE TO RELATED APPLICATIONS

This application is a continuation of U.S. application Ser. No. 12/958,825, filed on Dec. 2, 2010, which claims the benefit of U.S. Provisional Application No. 61/267,756, filed on Dec. 8, 2009, the disclosures of which are incorporated herein by reference in their entirety This application also is a continuation-in-part of U.S. application Ser. No. 12/611,062, filed on Nov. 2, 2009, which is a continuation of U.S. application Ser. No. 11/689,381, filed on Mar. 21, 2007, which claims the benefit of U.S. Provisional Application No. 60/784,863, filed on Mar. 21, 2006, the disclosures of which are incorporated herein by reference in their entirety.

FIELD OF THE INVENTION

The invention relates generally to luminescent materials. More particularly, the invention relates to luminescent materials that emit light in the visible range or the near infrared range and methods of forming such materials.

BACKGROUND OF THE INVENTION

A solar module operates to convert energy from solar radiation into electricity, which is delivered to an external load to perform useful work. A solar module typically includes a set of photovoltaic ("PV") cells, which can be connected in parallel, in series, or a combination thereof. The most common type of PV cell is a p-n junction device based on crystalline silicon. Other types of PV cells can be based on amorphous silicon, polycrystalline silicon, germanium, organic materials, and Group 13-15 semiconductor materials, such as gallium arsenide.

During operation of an existing solar module, incident solar radiation penetrates below a surface of the PV cell and is absorbed within the PV cell. A depth at which the solar radiation penetrates below the surface can depend upon an absorption coefficient of the PV cell. In the case of a PV cell based on silicon, an absorption coefficient of silicon varies with wavelength of solar radiation. For example, for solar radiation at 900 nm, silicon has an absorption coefficient of about 100 $cm^{-1}$, and the solar radiation can penetrate to a depth of about 100 μm. In contrast, for solar radiation at 450 nm, the absorption coefficient is greater at about $10^4$ $cm^{-1}$, and the solar radiation can penetrate to a depth of about 1 μm. At a particular depth within the PV cell, absorption of solar radiation produces charge carriers in the form of electron-hole pairs. Electrons exit the PV cell through one electrode, while holes exit the PV cell through another electrode. The net effect is a flow of an electric current through the PV cell driven by incident solar radiation. The inability to convert the total incident solar radiation to useful electrical energy represents a loss or inefficiency of the solar module.

Current solar modules typically suffer a number of technical limitations on the ability to efficiently convert incident solar radiation to useful electrical energy. One significant loss mechanism typically derives from a mismatch between an incident solar spectrum and an absorption spectrum of PV cells. In the case of a PV cell based on silicon, photons with energy greater than a bandgap energy of silicon can lead to the production of photo-excited electron-hole pairs with excess energy. Such excess energy is typically not converted into electrical energy but is rather typically lost as heat through hot charge carrier relaxation or thermalization. This heat can raise the temperature of the PV cell and, as result, can reduce the efficiency of the PV cell in terms of its ability to produce electron-hole pairs. In some instances, the efficiency of the PV cell can decrease by about 0.5 percent for every 1° C. rise in temperature. In conjunction with these thermalization losses, photons with energy less than the bandgap energy of silicon are typically not absorbed and, thus, typically do not contribute to the conversion into electrical energy. As a result, a small range of the incident solar spectrum near the bandgap energy of silicon can be efficiently converted into useful electrical energy.

Also, in accordance with a junction design of a PV cell, charge separation of electron-hole pairs is typically confined to a depletion region, which can be limited to a thickness of about 1 μm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current.

It is against this background that a need arose to develop the luminescent materials described herein.

SUMMARY OF THE INVENTION

Luminescent materials according to various embodiments of the invention can exhibit a number of desirable characteristics. In some embodiments, the luminescent materials can exhibit photoluminescence with a high quantum efficiency, with a narrow spectral width, and with a peak emission wavelength located within a desirable range of wavelengths, such as the visible range or the near infrared range. Also, these photoluminescent characteristics can be relatively insensitive over a wide range of excitation wavelengths. The luminescent materials can have other desirable characteristics, such as relating to their bandgap energies and electrical conductivities. Advantageously, the luminescent materials can be inexpensively and readily formed for use in solar modules and other applications.

In one embodiment, a luminescent material has the formula:

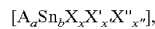

wherein the luminescent material is polycrystalline;

A is included in the luminescent material as a monovalent cation;

X, X', and X" are selected from fluorine, chlorine, bromine, and iodine;

a is in the range of 1 to 5;

b is in the range of 1 to 3;

a sum of x, x', and x" is in the range of 1 to 5; and at least X' is iodine, such that $x'/(x+x'+x'') \geq 1/5$.

In another embodiment, a method of forming a luminescent material includes: (1) providing a source of A and X, wherein A is selected from at least one of elements of Group 1, and X is selected from at least one of elements of Group 17; (2) providing a source of B, wherein B is selected from at least one of elements of Group 14; (3) subjecting the source of A and X and the source of B to vacuum deposition to form a set of films adjacent to a substrate; and (4) heating the set of films to a temperature $T_{heat}$ to form a luminescent material adjacent to the substrate, wherein the luminescent material includes A, B, and X, one of the source of A and X and the source of B has a lower melting point $T_{m1}$, another of the source of A and X and the source of B has a higher melting point $T_{m2}$, and $T_{m1} < T_{heat} < T_{m2}$.

Other aspects and embodiments of the invention are also contemplated. The foregoing summary and the following detailed description are not meant to restrict the invention to any particular embodiment but are merely meant to describe various embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

Figure 1:
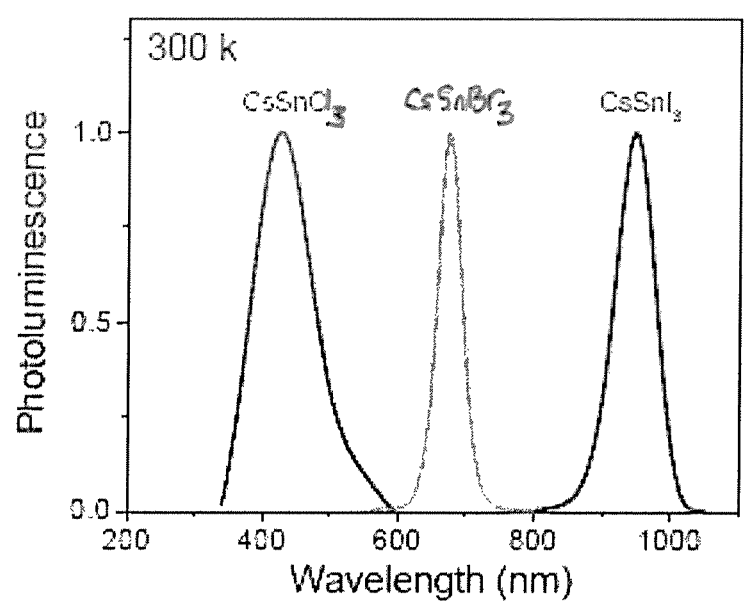
FIG. 1 illustrates normalized emission spectra of a set of luminescent materials, according to an embodiment of the invention.

As used herein, the singular terms "a," "an," and "the" include plural referents unless the context clearly dictates otherwise. Thus, for example, reference to a luminescent material can include multiple luminescent materials unless the context clearly dictates otherwise.

As used herein, the term "set" refers to a collection of one or more elements. Thus, for example, a set of layers can include a single layer or multiple layers. Elements of a set can also be referred to as members of the set. Elements of a set can be the same or different. In some instances, elements of a set can share one or more common characteristics.

As used herein, the term "adjacent" refers to being near or adjoining Adjacent elements can be spaced apart from one another or can be in actual or direct contact with one another. In some instances, adjacent elements can be connected to one another or can be formed integrally with one another.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the embodiments described herein.

As used herein, the terms "optional" and "optionally" mean that the subsequently described event or circumstance may or may not occur and that the description includes instances where the event or circumstance occurs and instances in which it does not.

As used herein, the term "size" refers to a characteristic dimension of an object. Thus, for example, a size of an object that is spherical can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. Alternatively, or in conjunction, a size of a non-spherical object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

As used herein, the term "sub-micron range" refers to a general range of dimensions less than about 1 µm or less than about 1,000 nm, such as less than about 999 nm, less than about 900 nm, less than about 800 nm, less than about 700 nm, less than about 600 nm, less than about 500 nm, less than about 400 nm, less than about 300 nm, or less than about 200 nm, and down to about 1 nm or less. In some instances, the term can refer to a particular sub-range within the general range, such as from about 1 nm to about 100 nm, from about 100 nm to about 200 nm, from about 200 nm to about 300 nm, from about 300 nm to about 400 nm, from about 400 nm to about 500 nm, from about 500 nm to about 600 nm, from about 600 nm to about 700 nm, from about 700 nm to about 800 nm, from about 800 nm to about 900 nm, or from about 900 nm to about 999 nm.

As used herein, the term "ultraviolet range" refers to a range of wavelengths from about 5 nm to about 400 nm.

As used herein, the term "visible range" refers to a range of wavelengths from about 400 nm to about 700 nm.

As used herein, the term "infrared range" refers to a range of wavelengths from about 700 nm to about 2 mm. The infrared range includes the "near infrared range," which refers to a range of wavelengths from about 700 nm to about 5 µm, the "middle infrared range," which refers to a range of wavelengths from about 5 µm to about 30 µm, and the "far infrared range," which refers to a range of wavelengths from about 30 µm to about 2 mm.

As used herein, the terms "reflection," "reflect," and "reflective" refer to a bending or a deflection of light, and the term "reflector" refers to an element that causes, induces, or is otherwise involved in such bending or deflection. A bending or a deflection of light can be substantially in a single direction, such as in the case of specular reflection, or can be in multiple directions, such as in the case of diffuse reflection or scattering. In general, light incident upon a material and light reflected from the material can have wavelengths that are the same or different.

As used herein, the terms "luminescence," "luminesce," and "luminescent" refer to an emission of light in response to an energy excitation. Luminescence can occur based on relaxation from excited electronic states of atoms or molecules and can include, for example, chemiluminescence, electroluminescence, photoluminescence, thermoluminescence, triboluminescence, and combinations thereof. Luminescence can also occur based on relaxation from excited states of quasi-particles, such as excitons, bi-excitons, and exciton-polaritons. For example, in the case of photoluminescence, which can include fluorescence and phosphorescence, an excited state can be produced based on a light excitation, such as absorption of light. In general, light incident upon a material and light emitted by the material can have wavelengths that are the same or different.

As used herein, the term "optical quantum efficiency" or "OQE" refers to a ratio of the number of photons emitted by a photoluminescent material to the number of photons absorbed by the photoluminescent material. In some instances, an optical quantum efficiency can be represented as: $OQE = \eta_1 \eta_2$, where $\eta_1$ corresponds to a fraction of absorbed photons leading to the formation of excited states, such as excited states of excitons, and $\eta_2$ corresponds to an "internal quantum efficiency," namely a fraction of excited states undergoing radiative decay that yields emitted photons.

As used herein, the term "absorption spectrum" refers to a representation of absorption of light over a range of wavelengths. In some instances, an absorption spectrum can refer to a plot of absorbance (or transmittance) of a material as a function of wavelength of light incident upon the material.

As used herein, the term "emission spectrum" refers to a representation of emission of light over a range of wavelengths. In some instances, an emission spectrum can refer to a plot of intensity of light emitted by a material as a function of wavelength of the emitted light.

As used herein, the term "excitation spectrum" refers to another representation of emission of light over a range of wavelengths. In some instances, an excitation spectrum can refer to a plot of intensity of light emitted by a material as a function of wavelength of light incident upon the material.

As used herein, the term "Full Width at Half Maximum" or "FWHM" refers to a measure of spectral width. In some instances, a FWHM can refer to a width of a spectrum at half of a peak intensity value.

As used herein with respect to a photoluminescent characteristic, the term "substantially flat" refers to being substantially invariant with respect to a change in wavelength. In some instances, a photoluminescent characteristic can be referred to as being substantially flat over a range of wavelengths if values of that characteristic within that range of wavelengths exhibit a standard deviation of less than 20 percent with respect to an average value, such as less than 10 percent or less than 5 percent.

As used herein with respect to an emission spectrum, the term "substantially monochromatic" refers to emission of light over a narrow range of wavelengths. In some instances, an emission spectrum can be referred to as being substantially monochromatic if a spectral width is no greater than 120 nm at FWHM, such as no greater than 100 nm at FWHM, no greater than 80 nm at FWHM, or no greater than 50 nm at FWHM.

As used herein, the term "dopant" refers to a chemical entity that is present in a material as an additive or an impurity. In some instances, the presence of a dopant in a material can alter a set of characteristics of the material, such as its chemical, magnetic, electronic, or optical characteristics.

As used herein, the term "electron acceptor" refers to a chemical entity that has a tendency to attract an electron from another chemical entity, while the term "electron donor" refers to a chemical entity that has a tendency to provide an electron to another chemical entity. In some instances, an electron acceptor can have a tendency to attract an electron from an electron donor. It should be recognized that electron attracting and electron providing characteristics of a chemical entity are relative. In particular, a chemical entity that serves as an electron acceptor in one instance can serve as an electron donor in another instance. Examples of electron acceptors include positively charged chemical entities and chemical entities including atoms with relatively high electronegativities. Examples of electron donors include negatively charged chemical entities and chemical entities including atoms with relatively low electronegativities.

A set of characteristics of a material can sometimes vary with temperature. Unless otherwise specified herein, a characteristic of a material can be specified at room temperature, such as 300K or 27° C.

Luminescent Materials

Embodiments of the invention relate to luminescent materials having a number of desirable characteristics. In particular, luminescent materials according to some embodiments of the invention can exhibit photoluminescence with a high quantum efficiency, with a narrow spectral width, and with a peak emission wavelength located within a desirable range of wavelengths. Also, these photoluminescent characteristics can be relatively insensitive over a wide range of excitation wavelengths. Without being bound by a particular theory, these unusual and desirable characteristics can at least partly derive from a particular microstructure of the luminescent materials. Advantageously, the luminescent materials can be inexpensively and readily processed to form a variety of products, which, in turn, can be used in solar modules and other applications.

Desirable luminescent materials include a class of semiconductor materials that can be represented with reference to the formula:

$$[A_a B_b X_x][\text{dopants}] \qquad (1)$$

In formula (1), A is selected from elements of Group 1, such as sodium (e.g., as Na(I) or $Na^{+1}$), potassium (e.g., as K(I) or $K^{+1}$), rubidium (e.g., as Rb(I) or $Rb^{+1}$), and cesium (e.g., as Cs(I) or $Cs^{+1}$); B is selected from elements of Group 5, such as vanadium (e.g., as V(III) or $V^{+3}$), elements of Group 11, such as copper (e.g., as Cu(I) or $Cu^{+1}$), silver (e.g., as Ag(I) or $Ag^{+1}$), and gold (e.g., as Au(I) or $Au^{+1}$), elements of Group 12, such as zinc (e.g., as Zn(II) or $Zn^{+2}$), cadmium (e.g., as Cd(II) or $Cd^{+2}$), and mercury (e.g., as Hg(II) or $Hg^{+2}$), elements of Group 13, such as gallium (e.g., as Ga(I) or $Ga^{+1}$), indium (e.g., as In(I) or $In^{+1}$), and thallium (e.g., as Tl(I) or $Tl^{+1}$), elements of Group 14, such as germanium (e.g., as Ge(II) or $Ge^{+2}$ or as Ge(IV) or $Ge^{+4}$), tin (e.g., as Sn(II) or $Sn^{+2}$ or as Sn(IV) or $Sn^{+4}$), and lead (e.g., as Pb(II) or $Pb^{+2}$ or as Pb(IV) or $Pb^{+4}$), and elements of Group 15, such as bismuth (e.g., as Bi(III) or $Bi^{+3}$); and X is selected from elements of Group 17, such as fluorine (e.g., as $F^{-1}$), chlorine (e.g., as $Cl^{-1}$), bromine (e.g., as $Br^{-1}$), and iodine (e.g., as $I^{-1}$). Still referring to formula (1), a is an integer that can be in the range of 1 to 12, such as from 1 to 8 or from 1 to 5; b is an integer that can be in the range of 1 to 8, such as from 1 to 5 or from 1 to 3; and x is an integer that can be in the range of 1 to 12, such as from 1 to 8 or from 1 to 5. In some instances, x can be equal to a+2b, such as for purposes of charge balance when oxidation states of A, B, and X are +1, +2, and −1, respectively. For example, a can be equal to 1, and x can be equal to 1+2b. It is also contemplated that one or more of a, b, and x can have fractional values within their respective ranges. It is also contemplated that $X_x$ in formula (1) can be more generally represented as $X_x X'_{x'}$ (or $X_x X'_{x'} X''_{x''}$), where X and X' (or X, X', and X") can be independently selected from elements of Group 17, and the sum of x and x' (or the sum of x, x', and x") can be in the range of 1 to 12, such as from 1 to 9 or from 1 to 5. With reference to the generalized version of formula (1), the sum of x and x' (or the sum of x, x', and x") can be equal to a+2b. For example, a can be equal to 1, and the sum of x and x' (or the sum of x, x', and x") can be equal to 1+2b. It is further contemplated that a blend or a mixture of different luminescent materials represented by formula (1) can be used. Dopants can be optionally included in a luminescent material represented by formula (1), and can be present in amounts that are less than about 5 percent, such as less than about 1 percent or from about 0.1 percent to about 1 percent, in terms of atomic percent or elemental composition. The dopants can derive from reactants that are used to form the luminescent material, or can derive from moisture, atmospheric gases, or other chemical entities present during the formation of the luminescent material. In particular, the dopants can include cations, anions, or both, which can form electron acceptor/electron donor pairs that are dispersed within a microstructure of the luminescent material.

Examples of luminescent materials represented by formula (1) include those represented with reference to the formula:

   (2)

In formula (2), A is selected from potassium, rubidium, and cesium; and X is selected from chlorine, bromine, and iodine. Still referring to formula (2), x can be equal to a+2b. In some instances, a can be equal to 1, and x can be equal to 1+2b. Several luminescent materials with desirable characteristics can be represented as $CsSnX_3$[dopants] and include materials designated as UD700 and UD930. In the case of UD700, X is bromine, and, in the case of UD930, X is iodine. UD700 exhibits a peak emission wavelength at about 695 nm, while UD930 exhibits a peak emission wavelength at about 950 nm. The spectral width of UD700 and UD930 is narrow (e.g., about 50 meV or less at FWHM), and the absorption spectrum is substantially flat from the absorption edge into the far ultraviolet. Photoluminescent emission of UD700 and UD930 is stimulated by a wide range of wavelengths of solar radiation up to the absorption edge of these materials at about 695 nm for UD700 and about 950 nm for UD930. The chloride analog, namely $CsSnCl_3$[dopants], exhibits a peak emission wavelength at about 450 nm, and can be desirable for certain implementations. Normalized emission spectra of UD700, UD930, and the chloride analog, as measured using a xenon lamp source at about 300K, are illustrated in FIG. 1 in accordance with an embodiment of the invention. Other luminescent materials with desirable characteristics include $CsSn_2X_5$[dopants], $Cs_2SnX_4$[dopants], and $CsSn_3X_7$[dopants], mixtures thereof with, or without, $CsSnX_3$[dopants], such as a mixture of $CsSnX_3$[dopants], $CsSn_2X_5$[dopants], and $Cs_2SnX_4$[dopants], and luminescent materials in which at least a fraction of cesium is substituted with another monovalent ion of comparable size, such as $CH_3NH_3^+$ or other poly-elemental, monovalent ions. Additional luminescent materials with desirable characteristics include $RbSnX_3$[dopants], such as $RbSnI_3$[dopants] that exhibits a peak emission wavelength at about 705 nm, and $RbSnBr_3$[dopants] that exhibits a peak emission wavelength at about 540 nm. Further luminescent materials with desirable characteristics include $KSnX_3$[dopants], such as $KSnBr_3$[dopants] that exhibits a peak emission wavelength at about 465 nm. Each of these luminescent materials can be deposited as a film in a single layer or in multiple layers interspersed with other layers formed from the same luminescent material or different luminescent materials.

Additional examples of luminescent materials represented by formula (1) include those represented with reference to the formula:

   (3)

In formula (3), A is selected from potassium, rubidium, and cesium; and X is selected from chlorine, bromine, and iodine. Still referring to formula (3), x can be equal to a+2b. In some instances, a can be equal to 1, and x can be equal to 1+2b. In the case that A is cesium, and X is iodine, for example, a luminescent material can sometimes be represented with reference to the formula:

   (4)

Additional examples of luminescent materials represented by formula (1) include those represented with reference to the formula:

   (5)

In formula (5), A is selected from potassium, rubidium, and cesium; and X is selected from chlorine, bromine, and iodine. Still referring to formula (5), x can be equal to a+2b. In some instances, a can be equal to 1, and x can be equal to 1+2b. In the case that A is cesium, and X is iodine, for example, a luminescent material can sometimes be represented with reference to the formula:

   (6)

Additional examples of luminescent materials represented by formula (1) include those represented with reference to the formula:

   (7)

In formula (7), A is selected from potassium, rubidium, and cesium; and X and X' are different and are selected from fluorine, chlorine, bromine, and iodine. Still referring to formula (7), the sum of x and x' can be equal to a+2b. In order to achieve desirable photoluminescent characteristics, at least one of X and X' can be iodine, which can constitute at least ⅕, at least ¼, at least ⅓, at least ½, or at least ⅔ of a total number of halide ions. For example, in the case that X' is iodine, x'/(a+2b)≥⅕, ≥¼, ≥⅓, ≥½, or ≥⅔. In some instances, a can be equal to 1, and the sum of x and x' can be equal to 1+2b. In the case that A is cesium, X is chlorine, and X' is iodine, for example, a luminescent material can sometimes be represented with reference to one of the formulas:

   (8)

   (9)

   (10)

   (11)

| | |
|---|---|
| [CsSn$_2$ClI$_4$][dopants] | (12) |
| [CsSn$_2$Cl$_4$I][dopants] | (13) |
| [Cs$_2$SnClI$_3$][dopants] | (14) |
| [Cs$_2$SnCl$_2$I$_2$][dopants] | (15) |
| [Cs$_2$SnCl$_3$I][dopants] | (16) |

And, in the case that A is cesium, X is bromine, and X' is iodine, for example, a luminescent material can sometimes be represented with reference to one of the formulas:

| | |
|---|---|
| [CsSnBrI$_2$][dopants] | (17) |
| [CsSnBr$_2$I][dopants] | (18) |
| [CsSn$_2$Br$_2$I$_3$][dopants] | (19) |
| [CsSn$_2$Br$_3$I$_2$][dopants] | (20) |
| [CsSn$_2$BrI$_4$][dopants] | (21) |
| [CsSn$_2$Br$_4$I][dopants] | (22) |
| [Cs$_2$SnBrI$_3$][dopants] | (23) |
| [Cs$_2$SnBr$_2$I$_2$][dopants] | (24) |
| [Cs$_2$SnBr$_3$I][dopants] | (25) |

And, in the case that A is cesium, X is fluorine, and X' is iodine, for example, a luminescent material can sometimes be represented with reference to one of the formulas:

| | |
|---|---|
| [CsSnFI$_2$][dopants] | (26) |
| [CsSnF$_2$I][dopants] | (27) |
| [CsSn$_2$F$_2$I$_3$][dopants] | (28) |
| [CsSn$_2$F$_3$I$_2$][dopants] | (29) |
| [CsSn$_2$FI$_4$][dopants] | (30) |
| [CsSn$_2$F$_4$I][dopants] | (31) |
| [Cs$_2$SnFI$_3$][dopants] | (32) |
| [Cs$_2$SnF$_2$I$_2$][dopants] | (33) |
| [Cs$_2$SnF$_3$I][dopants] | (34) |

Further examples of luminescent materials represented by formula (1) include those represented with reference to the formula:

| | |
|---|---|
| [A$_a$Sn$_b$X$_x$X'$_{x'}$X''$_{x''}$][dopants] | (35) |

In formula (35), A is selected from potassium, rubidium, and cesium; and X, X', and X'' are different and are selected from fluorine, chlorine, bromine, and iodine. Still referring to formula (35), the sum of x, x', and x'' can be equal to a+2b. In order to achieve desirable photoluminescent characteristics, at least one of X, X', and X'' can be iodine, which can constitute at least ⅕, at least ¼, at least ⅓, at least ½, or at least ⅔ of a total number of halide ions. For example, in the case that X' is iodine, x'/(a+2b)≥⅕, ≥¼, ≥⅓, ≥½, or ≥⅔. In some instances, a can be equal to 1, and the sum of x, x', and x'' can be equal to 1+2b. In the case that A is cesium, X is chlorine, X' is iodine, and X'' is bromine, for example, a luminescent material can sometimes be represented with reference to one of the formulas:

| | |
|---|---|
| [CsSnClIBr][dopants] | (36) |
| [CsSn$_2$ClI$_{x'}$Br$_{4-x'}$][dopants], x'=1, 2, or 3 | (37) |
| [CsSn$_2$Cl$_2$I$_x$Br$_{3-x'}$][dopants], x'=1 or 2 | (38) |
| [CsSn$_2$Cl$_3$IBr][dopants] | (39) |
| [Cs$_2$SnClI$_x$Br$_{3-x'}$][dopants], x'=1 or 2 | (40) |
| [Cs$_2$SnCl$_2$IBr][dopants] | (41) |

And, in the case that A is cesium, X is chlorine, X' is iodine, and X'' is fluorine, for example, a luminescent material can sometimes be represented with reference to one of the formulas:

| | |
|---|---|
| [CsSnClIF][dopants] | (42) |
| [CsSn$_2$ClI$_{x'}$F$_{4-x'}$][dopants], x'=1, 2, or 3 | (43) |
| [CsSn$_2$Cl$_2$I$_x$F$_{3-x'}$][dopants], x'=1 or 2 | (44) |
| [CsSn$_2$Cl$_3$IF][dopants] | (45) |
| [Cs$_2$SnClI$_x$F$_{3-x'}$][dopants], x'=1 or 2 | (46) |
| [Cs$_2$SnCl$_2$IF][dopants] | (47) |

Figure 2:
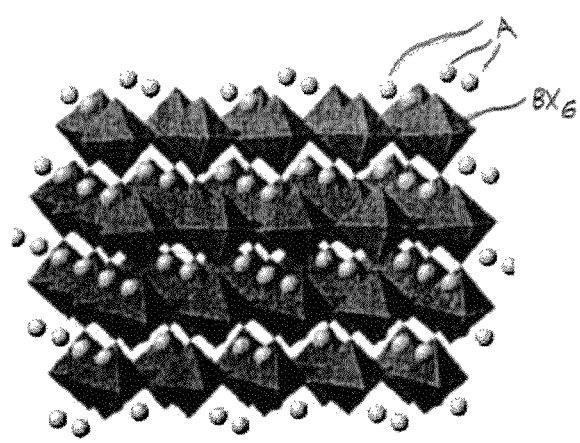
FIG. 2 illustrates a perovskite-based microstructure of certain luminescent materials, according to an embodiment of the invention.
Figure 3:
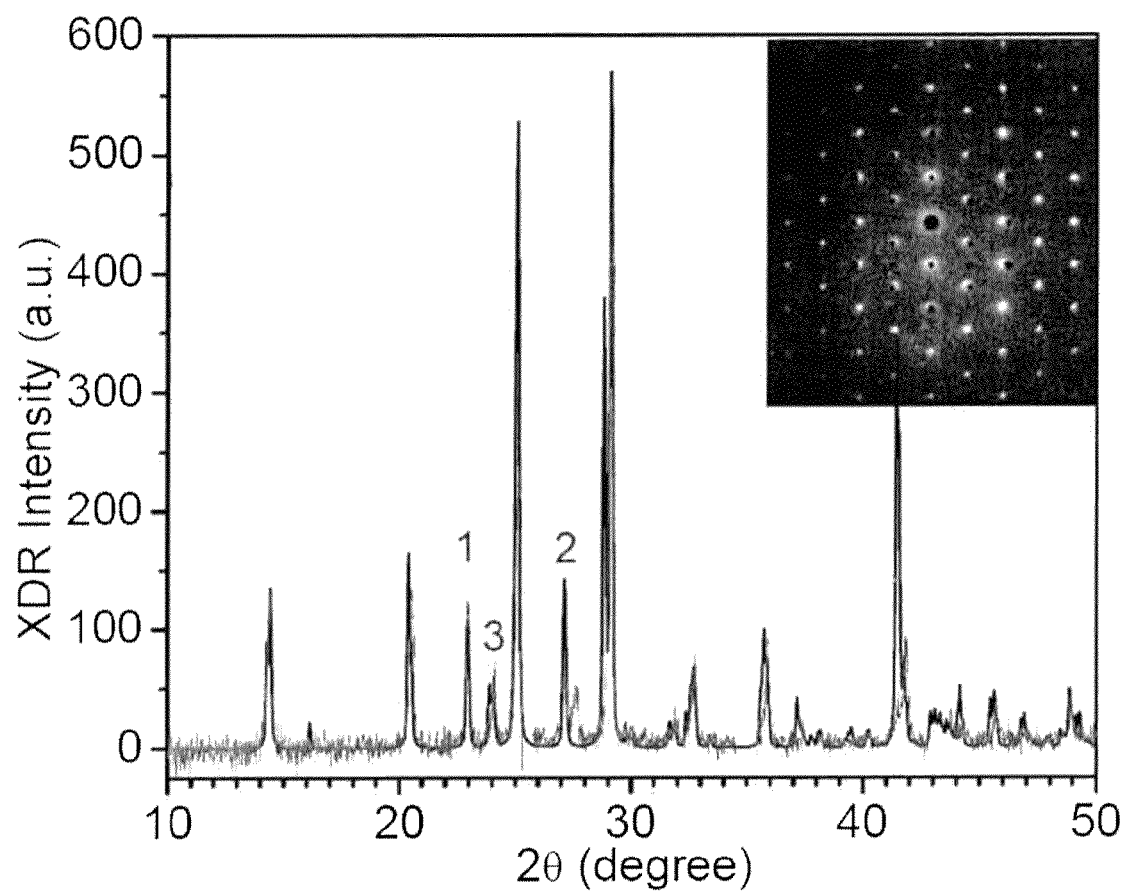
FIG. 3 illustrates X-ray diffraction data for UD930, according to an embodiment of the invention.

Certain luminescent materials represented by formula (1) can have a perovskite-based microstructure. This perovskite-based microstructure can be layered with relatively stronger chemical bonding within a particular layer and relatively weaker chemical bonding between different layers. In particular, certain luminescent materials represented by formula (1) can have a perovskite-based crystal structure. This structure can be arranged in the form of a network of BX$_6$ octahedral units along different planes, with B at the center of each octahedral unit and surrounded by X, and with A interstitial between the planes, as illustrated in FIG. 2 in accordance with an embodiment of the invention, where B is a cation, X is a monovalent anion, and A is a cation that serves to balance the total charge and to stabilize the crystal structure. Certain aspects of a perovskite-based microstructure can be observed in X-ray diffraction ("XRD") data, as illustrated in FIG. 3 for UD930 in accordance with an embodiment of the invention.

Referring back to FIG. 2, dopants can be incorporated in a perovskite-based crystal structure, as manifested by, for example, substitution of a set of atoms included in the structure with a set of dopants. In the case of UD930, for example, either, or both, Cs$^{+1}$ and Sn$^{+2}$ can be substituted with a cation such as Sn(IV) or Sn$^{+4}$, and I$^{-1}$ can be substituted with an anion such as F$^{-1}$, Cl$^{-1}$, Br$^{-1}$, O$^{-2}$, OH$^{-1}$, or other anions with smaller radii relative to I$^{-1}$. The incorporation of dopants can alter a perovskite-based crystal structure relative to the absence of the dopants, as manifested by, for example, shorter bond lengths along a particular plane and between different planes, such as shorter B—X—B bond lengths along a particular plane and shorter B—X—B bond lengths between different planes. In some instances, substitution of I$^{-1}$ with either, or both, of F$^{-1}$ and Cl$^{-1}$ can lead to shorter and stronger bonds with respect to Sn$^{-2}$ along a particular plane and between different planes. Without being bound by a particular theory, the incorporation of dopants can lend greater stability to a perovskite-based crystal structure, and desirable photoluminescent characteristics can at least partly derive from the presence of these dopants. In some instances, substitution of I$^{-1}$ with other halides can be at levels greater than typical doping levels, such as up to about 50 percent of I$^{-1}$ to form an alloy of mixed halides.

Certain luminescent materials represented by formula (1) can be polycrystalline with constituent crystallites or grains having sizes in the sub-micron range. The configuration of grains can vary from one that is quasi-isotropic, namely in which the grains are relatively uniform in shape and size and exhibit a relatively uniform grain boundary orientation, to one that is anisotropic, namely in which the grains exhibit relatively large deviations in terms of shape, size, grain boundary orientation, texture, or a combination thereof. In the case of UD930, for example, grains can be formed in an anisotropic fashion and with an average size in the range of about 200 nm to about 400 nm, such as from about 250 nm to about 350 nm.

Several luminescent materials represented by formula (1) have characteristics that are desirable for solar modules. In particular, the luminescent materials can exhibit photoluminescence with a high optical quantum efficiency that is greater than about 6 percent, such as at least about 10 percent, at least about 20 percent, at least about 25 percent, at least about 30 percent, or at least about 35 percent, and can be up to about 40 percent, about 50 percent, or more, and with a high internal quantum efficiency that is greater than about 50 percent, such as at least about 60 percent, at least about 70 percent, at least about 75 percent, at least about 80 percent, or at least about 85 percent, and can be up to about 95 percent, about 99 percent, or more. Also, the luminescent materials can exhibit photoluminescence with a narrow spectral width that is no greater than about 120 nm at FWHM, such as no greater than about 100 nm or no greater than about 80 nm at FWHM. Thus, for example, the spectral width can be in the range of about 20 nm to about 120 nm at FWHM, such as from about 50 nm to about 120 nm, from about 50 nm to about 100 nm, or from about 50 nm to about 80 nm at FWHM. Incorporation of the luminescent materials within a resonant cavity waveguide can further narrow the spectral width.

In addition, the luminescent materials can have bandgap energies and resistivities that are tunable to desirable levels by adjusting reactants and processing conditions that are used. For example, a bandgap energy can correlate with A, with the order of increasing bandgap energy corresponding to, for example, cesium, rubidium, potassium, and sodium. As another example, the bandgap energy can correlate with X, with the order of increasing bandgap energy corresponding to, for example, iodine, bromine, chlorine, and fluorine. This order of increasing bandgap energy can translate into an order of decreasing peak emission wavelength. Thus, for example, a luminescent material including iodine can sometimes exhibit a peak emission wavelength in the range of about 900 nm to about 1 µm, while a luminescent material including bromine or chlorine can sometimes exhibit a peak emission wavelength in the range of about 700 nm to about 800 nm. By tuning bandgap energies, the resulting photoluminescence can have a peak emission wavelength located within a desirable range of wavelengths, such as the visible range or the infrared range. In some instances, the peak emission wavelength can be located in the near infrared range, such as from about 900 nm to about 1 µm, from about 910 nm to about 1 µm, from about 910 nm to about 980 nm, or from about 930 nm to about 980 nm.

Moreover, the photoluminescence characteristics described above can be relatively insensitive over a wide range of excitation wavelengths. Indeed, this unusual characteristic can be appreciated with reference to excitation spectra of the luminescent materials, which excitation spectra can be substantially flat over a range of excitation wavelengths encompassing portions of the ultraviolet range, the visible range, and the infrared range. In some instances, the excitation spectra can be substantially flat over a range of excitation wavelengths from about 200 nm to about 1 µm, such as from about 200 nm to about 980 nm or from about 200 nm to about 950 nm. Similarly, absorption spectra of the luminescent materials can be substantially flat over a range of excitation wavelengths encompassing portions of the ultraviolet range, the visible range, and the infrared range. In some instances, the absorption spectra can be substantially flat over a range of excitation wavelengths from about 200 nm to about 1 µm, such as from about 200 nm to about 980 nm or from about 200 nm to about 950 nm. Also, optical quantum efficiencies of the luminescent materials can be substantially flat over a range of excitation wavelengths, such as from about 200 nm to about 1 µm, from about 200 nm to about 980 nm or from about 450 nm to about 900 nm.

For example, UD930 has a direct bandgap with a value of about 1.32 eV at 300K. This bandgap can decrease as temperature decreases, at least partly resulting from an harmonicity in a lattice potential. Without being bound by a particular theory, photoluminescence for UD930 (and certain other luminescent materials represented by formula (1)) can occur via exciton emission. An exciton corresponds to an electron-hole pair, which can be formed as a result of light absorption. Most semiconductor materials have relatively small exciton binding energies, so excitons are typically not present at room temperature. Certain luminescent materials represented by formula (1) can have relatively large exciton binding energies, and can be incorporated in a resonant cavity waveguide to yield suppression of emission in a vertical direction and stimulated emission along a plane of the cavity waveguide. The larger a Stokes shift, or exciton binding energy, the more tolerant the cavity waveguide can be with respect to imperfections. Thus, the cavity waveguide can be readily formed in an inexpensive manner, without resorting to techniques such as Molecular Beam Epitaxy ("MBE").

Figure 4:
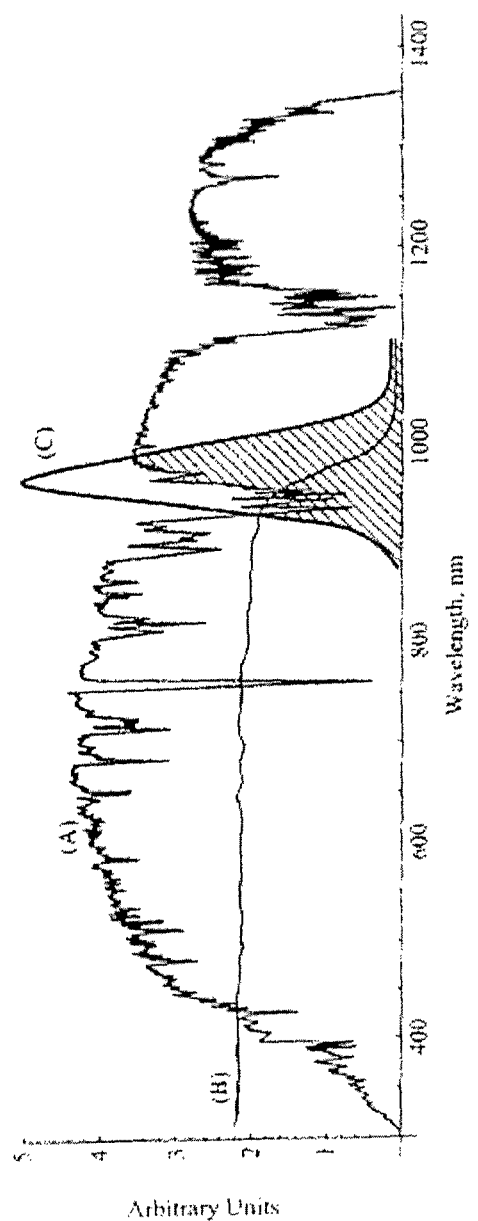
FIG. 4 illustrates a combined representation of an incident solar spectrum and measured absorption and emission spectra of UD930 in accordance with an embodiment of the invention.

Desirable characteristics of UD930 can be further appreciated with reference to FIG. 4, which illustrates a combined representation of a solar spectrum and measured absorption and emission spectra of UD930 in accordance with an embodiment of the invention. In particular, FIG. 4 illustrates the AM1.5G solar spectrum (referenced as (A)), which is a standard solar spectrum representing incident solar radiation on the surface of the earth. The AM1.5G solar spectrum has a gap in the region of 930 nm due to atmospheric absorption. In view of the AM1.5G solar spectrum and characteristics of PV cells based on silicon, the absorption spectrum (referenced as (B)) and emission spectrum (referenced as (C)) of UD930 render this material particularly effective for spectral concentration when incorporated within an emission layer. In particular, photoluminescence of UD930 is substantially located in the gap of the AM1.5G solar spectrum, with the peak emission wavelength of about 950 nm falling within the gap. This, in turn, allows the use of reflector layers (e.g., above and below the emission layer) that are tuned to reflect emitted radiation back towards the emission layer, without significant reduction of incident solar radiation that can pass through the reflector layers and reach UD930. Also, the absorption spectrum of UD930 is substantially flat and extends from the absorption edge at about 950 nm through a large fraction of the AM1.5G solar spectrum into the ultraviolet. In addition, the peak emission wavelength of about 950 nm (or about 1.32 eV) is matched to the absorption edge of PV cells based on silicon, and the spectral width is about 50 meV at FWHM (or about 37 nm at FWHM). The absorption coefficient of silicon is about $10^2$ cm$^{-1}$ in this range of emission wavelengths, and junctions within the PV cells can be designed to efficiently absorb the emitted radiation and convert the radiation into electron-hole pairs. As a result, UD930 can broadly absorb a wide range of wavelengths from incident solar radiation, while emitting a narrow range of wavelengths that are matched to silicon to allow a high conversion efficiency of incident solar radiation into electricity. Furthermore, the absorption spectrum and the emission spectrum of UD930 overlap to a low degree, thereby reducing instances of self-absorption that would otherwise lead to reduced conversion efficiency.

Methods of Forming Luminescent Materials

Luminescent materials represented by formula (1) can be formed via reaction of a set of reactants or precursors at high yields and at moderate temperatures and pressures. The reaction can be represented with reference to the formula:

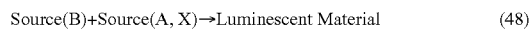

$$\text{Source(B)} + \text{Source(A, X)} \rightarrow \text{Luminescent Material} \qquad (48)$$

In formula (48), source(B) serves as a source of B, and, in some instances, source(B) can also serve as a source of dopants or halide ions. In the case that B is germanium, tin, or lead, for example, source(B) can include one or more types of B-containing compounds selected from B(II) compounds of the form BY, $BY_2$, $B_3Y_2$, and $B_2Y$ and B(IV) compounds of the form $BY_4$, where Y can be selected from elements of Group 16, such as oxygen (e.g., as $O^{-2}$); elements of Group 17, such as fluorine (e.g., as $F^{-1}$), chlorine (e.g., as $Cl^{-1}$), bromine (e.g., as $Br^{-1}$), and iodine (e.g., as $I^{-1}$); and polyelemental chemical entities, such as nitrate (i.e., $NO_3^{-1}$), thiocyanate (i.e., $SCN^{-1}$), hypochlorite (i.e., $OCl^{-1}$), sulfate (i.e., $SO_4^{-2}$), orthophosphate (i.e., $PO_4^{-3}$), metaphosphate (i.e., $PO_3^{-1}$), oxalate (i.e., $C_2O_4^{-2}$), methanesulfonate (i.e., $CH_3SO_3^{-1}$), trifluoromethanesulfonate (i.e., $CF_3SO_3^{-1}$), and pyrophosphate (i.e., $P_2O_7^{4}$). Examples of tin(II) compounds include tin(II) fluoride (i.e., $SnF_2$), tin(II) chloride (i.e., $SnCl_2$), tin(II) chloride dihydrate (i.e., $SnCl_2.2H_2O$), tin(II) bromide (i.e., $SnBr_2$), tin(II) iodide (i.e., $SnI_2$), tin(II) oxide (i.e., SnO), tin(II) sulfate (i.e., $SnSO_4$), tin(II) orthophosphate (i.e., $Sn_3(PO_4)_2$), tin(II) metaphosphate (i.e., $Sn(PO_3)_2$), tin (II) oxalate (i.e., $Sn(C_2O_4)$), tin(II) methanesulfonate (i.e., $Sn(CH_3SO_3)_2$), tin(II) pyrophosphate (i.e., $Sn_2P_2O_7$), and tin (II) trifluoromethanesulfonate (i.e., $Sn(CF_3SO_3)_2$). Examples of tin (IV) compounds include tin(IV) chloride (i.e., $SnCl_4$) and tin(IV) chloride pentahydrate (i.e., $SnCl_4.5H_2O$). It is contemplated that different types of source(B) can be used, such as source(B) and source(B'), with B and B' independently selected from elements of Group 14, or as source(B), source(B'), and source(B"), with B, B', and B" independently selected from elements of Group 14.

Still referring to formula (48), source(A, X) serves as a source of A and X, and, in some instances, source(A, X) can also serve as a source of dopants. Examples of source(A, X) include alkali halides of the form AX. In the case that A is cesium, potassium, or rubidium, for example, source(A, X) can include one or more types of A(I) halides, such as cesium (I) fluoride (i.e., CsF), cesium(I) chloride (i.e., CsCl), cesium (I) bromide (i.e., CsBr), cesium(I) iodide (i.e., CsI), potassium(I) fluoride (i.e., KF), potassium(I) chloride (i.e., KCl), potassium(I) bromide (i.e., KBr), potassium(I) iodide (i.e., KI), rubidium(I) fluoride (i.e., RbF), rubidium(I) chloride (i.e., RbCl), rubidium(I) bromide (i.e., RbBr), and rubidium (I) iodide (i.e., RbI). It is contemplated that different types of source(A, X) can be used, such as source(A, X) and source (A', X'), with A and A' independently selected from elements of Group 1, and X and X' independently selected from elements of Group 17, or as source(A, X), source(A', X'), and source(A", X"), with A, A', and A" independently selected from elements of Group 1, and X, X', and X" independently selected from elements of Group 17.

The reaction represented by formula (48) can be carried out by combining, mixing, or otherwise contacting source(B) with source(A, X), and then applying a form of energy. For some embodiments, source(B) and source(A, X) can be deposited on a substrate to form a set of films or layers. For example, source(B) and source(A, X) can be co-deposited on a substrate to form a film, or can be sequentially deposited to form adjacent films. Examples of suitable deposition techniques include vacuum deposition (e.g., thermal evaporation or electron-beam evaporation), Physical Vapor Deposition ("PVD"), Chemical Vapor Deposition ("CVD"), Atomic Layer Deposition ("ALD"), sputtering, spray coating, dip coating, web coating, wet coating, and spin coating. For other embodiments, source(B) and source(A, X) can be mixed in a dry form, in solution, or in accordance with any other suitable mixing technique. For example, source(B) and source(A, X) can be provided in a powdered form, and can be mixed using any suitable dry mixing technique. As another example, source(B) and source(A, X) can be dispersed in a reaction medium to form a reaction mixture, and the reaction medium can include a solvent or a mixture of solvents. Once source(B) and source(A, X) are suitably combined, a form of energy is applied to promote formation of a luminescent material, such as in the form of acoustic or vibrational energy, electrical energy, magnetic energy, mechanical energy, optical energy, or thermal energy. For example, source(B) and source(A, X) can be deposited on a substrate, and a resulting set of films can be heated to a suitable temperature to form the luminescent material. Heating can be performed in air, in an inert atmosphere (e.g., a nitrogen atmosphere), or in a reducing atmosphere for a suitable time period. It is also contemplated that multiple forms of energy can be applied simultaneously or sequentially.

The resulting luminescent material can include A, B, and X as major elemental components as well as elemental components derived from or corresponding to Y. Also, the luminescent material can include additional elemental components, such as carbon, chlorine, hydrogen, and oxygen, that can be present in amounts that are less than about 5 percent or less than about 1 percent in terms of elemental composition, and further elemental components, such as sodium, sulfur, phosphorus, and potassium, that can be present in trace amounts that are less than about 0.1 percent in terms of elemental composition.

Examples of the reaction represented by formula (48) include those represented with reference to the formula:

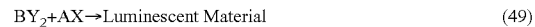

$$BY_2 + AX \rightarrow \text{Luminescent Material} \qquad (49)$$

In formula (49), B is selected from germanium, tin, and lead; Y is selected from fluorine, chlorine, bromine, and iodine; A is selected from potassium, rubidium, and cesium; and X is selected from fluorine, chlorine, bromine, and iodine. Still referring to formula (26), it is contemplated that $BY_2$ can be more generally represented as $BY_2$ and $B'Y'_2$ (or $BY_2$, $B'Y'_2$, and $B"Y"_2$), where B and B' (or B, B', and B") are independently selected from germanium, tin, and lead, and Y and Y' (or Y, Y', and Y") are independently selected from fluorine, chlorine, bromine, and iodine. In the case that B is tin, for example, $BY_2$ can be represented as $SnY_2$, or can be more generally represented as $SnY_2$ and $SnY'_2$ (or $SnY_2$, $SnY'_2$, and $SnY"_2$), where Y and Y' (or Y, Y', and Y") are independently selected from fluorine, chlorine, bromine, and iodine.

For example, $SnI_2$ (or $SnCl_2$) can be reacted with CsI to form a luminescent material having a peak emission wavelength at about 950 nm, such as UD930. As another example, $SnBr_2$ can be reacted with CsBr to form a luminescent material having a peak emission wavelength at about 695 nm, such as UD700. As another example, $SnBr_2$ can be reacted with KBr to form a luminescent material having a peak emission wavelength at about 465 nm. As another example, $SnI_2$ can be reacted with RbI to form a luminescent material having a peak emission wavelength at about 705 nm. As a further example, $SnBr_2$ can be reacted with RbBr to form a luminescent material having a peak emission wavelength at about 540 nm.

Attention next turns to FIG. 5 through FIG. 8, which illustrate manufacturing methods to form luminescent materials, according to some embodiments of the invention.

Figure 5:
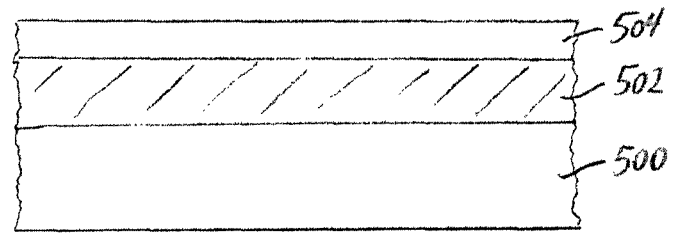
FIG. 5 through FIG. 8 illustrate manufacturing methods to form luminescent materials, according to some embodiments of the invention.

Referring first to FIG. 5, a substrate 500 is provided. The substrate 500 serves as a supporting structure during manufacturing operations, and serves to protect a resulting luminescent material from environmental conditions. The substrate 500 can be rigid or flexible, can be porous or non-porous, can be optically transparent, translucent, or opaque, and can be formed from a glass, a metal, a ceramic, a polymer, or another suitable material. For some implementations, the substrate 500 can include a base substrate and a set of coatings or films that are formed adjacent to the base substrate to provide a deposition surface for subsequent manufacturing operations. Examples of suitable coating materials include oxides, such as silica (i.e., $SiO_2$ or $\alpha\text{-}SiO_2$), alumina (i.e., $Al_2O_3$), $TiO_2$, $Ta_2O_5$, $Nb_2O_5$, $ZrO_2$, $HfO_2$, $SnO_2$, $ZnO_2$, $La_2O_3$, $Y_2O_3$, $CeO_2$, $Sc_2O_3$, $Er_2O_3$, $V_2O_5$, and $In_2O_3$; and other suitable thin-film dielectric materials.

Substrate effects can sometimes occur with respect to resulting photoluminescence characteristics. For example, enhancements of about three times or more in photoluminescence intensity, such as from about 5 times to about 10 times, can occur for alumina-based ceramic substrates, relative to substrates formed from certain other materials. Without being bound by a particular theory, such enhancements can at least partly derive from one or a combination of the following: a R1 R2 emission process; surface roughness of the alumina-based ceramic substrate; and high reflectivity of the alumina-based ceramic substrate, which can promote reflection of incident radiation back towards a luminescent material.

Next, as illustrated in FIG. 5, a set of reactants (that are precursors of a luminescent material) are deposited adjacent to the substrate 500. In the illustrated embodiment, source(B) and source(A, X) are subjected to vacuum deposition, thereby forming a precursor layer 502 adjacent to the substrate 500. Deposition can be carried out using a vacuum deposition system that is evacuated to a pressure no greater than about $1 \times 10^{-4}$ Torr, such as no greater than about $1 \times 10^{-5}$ Torr, and down to about $1 \times 10^{-6}$ Torr or less. It is contemplated that another suitable deposition technique can be used in place of, or in conjunction with, vacuum deposition.

Deposition of source(B) and source(A, X) can be carried out sequentially in accordance with the same vacuum deposition technique or different vacuum deposition techniques. For example, $BY_2$ and AX can be evaporated in sequential layers, from two layers to 30 or more layers total, such as from two layers to 16 layers total, or from two layers to six layers total, and with a weight or molar ratio of $BY_2$ to AX from about 99:1 to about 1:99, such as from about 5:1 to about 1:5 or from about 2:1 to about 1:2. A particular one of $BY_2$ and AX having a lower melting point $T_{m1}$ can be placed in an evaporator boat and deposited by thermal evaporation, while another one of $BY_2$ and AX having a higher melting point $T_{m2}$ can be placed in another evaporator boat and deposited by thermal evaporation or electron-beam evaporation. In the case of $SnI_2$ with a melting point of about 318° C. (or $SnCl_2$ with a melting point of about 246° C.) and CsI with a melting point of about 620° C., $SnI_2$ (or $SnCl_2$) can be deposited by thermal evaporation, while CsI can be deposited by thermal evaporation or electron-beam evaporation. A thickness of each individual $BY_2$-containing layer or each individual AX-containing layer can be in the range of about 10 nm to about 1.5 µm, such as from about 10 nm to about 1 µm or from about 10 nm to about 300 nm, with a total thickness for all layers in the range of about 20 nm to about 45 µm, such as from about 40 nm to about 20 µm or from about 50 nm to about 5 µm.

Source(B) and source(A, X) can also be co-deposited in accordance with a particular vacuum deposition technique. For example, $BY_2$ and AX can be co-evaporated to form a single layer or multiple layers, with a weight or molar ratio of $BY_2$ to AX from about 10:1 to about 1:10, such as from about 5:1 to about 1:5 or from about 2:1 to about 1:2, and with a total thickness in the range of about 10 nm to about 1.5 µm, such as from about 10 nm to about 1 µm or from about 10 nm to about 300 nm. In particular, $BY_2$ and AX can be mixed in an evaporator boat and then deposited by thermal evaporation. Mixing of $BY_2$ and AX can be carried out in a powdered form, or by forming a pre-melt of $BY_2$ and AX. In the case of $SnI_2$ (or $SnCl_2$) and CsI, $SnI_2$ (or $SnCl_2$) can evaporate at lower temperatures than CsI, and, therefore, a temperature of the evaporator boat can be gradually raised as a relative amount of CsI in a mixture increases.

Different types of source(B) can be used, and can be co-deposited with source(A, X) or deposited sequentially with source(A, X). For example, $BY_2$ and $B'Y'_2$ can be mixed in an evaporator boat and deposited by thermal evaporation, followed by deposition of AX, and so forth. Mixing of $BY_2$ and $B'Y'_2$ can be carried out in a powdered form, or by forming a pre-melt of $BY_2$ and $B'Y'_2$, with a weight or molar ratio of $BY_2$ to $B'Y'_2$ from about 99:1 to about 1:99, such as from about 5:1 to about 1:5 or from about 2:1 to about 1:2. As another example, $BY_2$, $B'Y'_2$, and $B''Y''_2$ can be mixed in an evaporator boat and deposited by thermal evaporation, followed by deposition of AX, and so forth. Likewise, different types of source(A, X) can be used, and can be co-deposited with source(B) or deposited sequentially with source(B).

Still referring to FIG. 5, an encapsulation material is next deposited, thereby forming an encapsulation layer 504 adjacent to the precursor layer 502. The encapsulation layer 504 serves to provide protection and sealing of a resulting luminescent material and to reduce its exposure to oxygen, humidity, and other contaminants, thereby enhancing stability of resulting photoluminescence characteristics. Examples of suitable encapsulation materials include oxides, such as silica, alumina, $TiO_2$, $Ta_2O_5$, $Nb_2O_5$, $ZrO_2$, $HfO_2$, $SnO_2$, $ZnO_2$, $La_2O_3$, $Y_2O_3$, $CeO_2$, $Sc_2O_3$, $Er_2O_3$, $V_2O_5$, and $In_2O_3$; nitrides, such as $SiO_xN_{2-x}$; fluorides, such as $CaF_2$, $SrF_2$, $ZnF_2$, $MgF_2$, $LaF_3$, and $GdF_2$; nanolaminates, such as $HfO_2/Ta_2O_5$, $TiO_2/Ta_2O_5$, $TiO_2/Al_2O_3$, $ZnS/Al_2O_3$, and AlTiO; and other suitable thin-film dielectric materials. Additional examples of suitable encapsulation materials include glasses, such as borosilicate glasses (e.g., Borofloat® glass and D 263™ glass), phosphate glasses, and other low melting glasses. A thickness of the encapsulation layer 504 can be in the range of about 10 nm to about 1.5 µm, such as from about 50 nm to about 500 nm or from about 50 nm to about 300 nm. In the case of a deposited layer of glass, a suitable metal can be deposited adjacent to the layer of glass to provide a hermetic seal, such as silver, aluminum, gold, copper, iron, cobalt, nickel, palladium, platinum, ruthenium, or iridium. Vacuum deposition, such as electron-beam evaporation, can be used to form the encapsulation layer 504, along with the other layers of the assembly of layers. Alternatively, another suitable deposition technique can be used, such as sputtering.

The assembly of layers is next subjected to annealing to promote bonding between the layers as well as to promote reaction according to formula (48), thereby converting the precursor layer 502 to an emission layer including a luminescent material according to formula (1). Annealing can be carried out using any suitable heating technique to apply thermal energy via conduction, convection, or radiation heating, such as by heating the assembly of layers using a hot plate, an oven, resist heating, or lamp heating. It is also contemplated that thermal energy can be applied in accordance with fast heating cycles to yield rapid thermal annealing.

Resulting photoluminescence characteristics can be dependent upon an annealing temperature and an annealing time period. As such, an annealing temperature and an annealing time period can be optimized to yield higher photoluminescence intensities. For example, a particular one of $BY_2$ and AX can have a lower melting point $T_{m1}$, another one of $BY_2$ and AX can have a higher melting point $T_{m2}$, and an optimal annealing temperature $T_{heat}$ can be greater than $T_{m1}$ and less than $T_{m2}$, such as greater than $T_{m1}$ and up to a three-quarters point (i.e., $(T_{m1}+3T_{m2})/4$) or a halfway point (i.e., $(T_{m1}+T_{m2})/2$) between the lower melting point and the higher melting point, although annealing can also be carried out at higher or lower temperatures. In the case of $SnI_2$ with a melting point of about 318° C. and CsI with a melting point of about 620° C., an optimal annealing temperature $T_{heat}$ can be greater than about 318° C. and less than about 620° C., such as from about 340° C. to about 420° C. or from about 350° C. to about 410° C. In the case of $SnCl_2$ with a melting point of about 246° C. and CsI with a melting point of about 620° C., an optimal annealing temperature $T_{heat}$ can be greater than about 246° C. and less than about 620° C. In some instances, an initial melting can arise from formation of an eutectic between $SnCl_2$ and a reaction product of $SnCl_2$ and CsI. An optimal annealing time period can be in the range of about 1 sec to about 1 hr, such as from about 5 sec to about 10 min or from about 5 sec to about 1 min, although annealing can also be carried out for longer or shorter time periods. Optimal values of an annealing temperature and an annealing time period can also be suitably adjusted depending upon, for example, particular reagents used, a thickness of individual layers within the precursor layer 502, or a total thickness of the precursor layer 502. In some instances, a reaction between layers of reactants can occur at temperatures significantly below melting temperatures of the reactants by way of solid state reactions. In particular, the layers can be sufficiently thin so that diffusion can occur within, for example, a few hundred nanometers or less and a time period of a few seconds to a few minutes, thereby allowing the reactants to react and to form a luminescent material.

Figure 6:
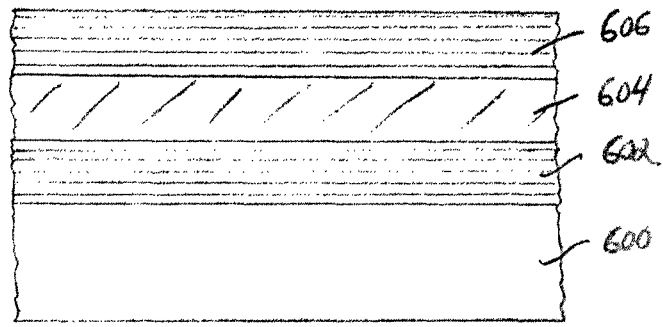

Referring next to FIG. 6, a substrate 600 is provided, and a precursor layer 604 is formed adjacent to the substrate 600. Certain aspects of the manufacturing method of FIG. 6 can be implemented in a similar manner as described above for FIG. 5, and, therefore, are not further described herein.

As illustrated in FIG. 6, a reflector layer 602 is initially formed adjacent to the substrate 600, followed by formation of the precursor layer 604 adjacent to the reflector layer 602, and followed by formation of another reflector layer 606 adjacent to the precursor layer 604. The pair of reflector layers 602 and 606 serve to provide protection and sealing of a resulting luminescent material and to reduce its exposure to oxygen, humidity, and other contaminants. In addition, the pair of reflector layers 602 and 606 serve to reduce loss of emitted radiation and to promote guiding of the emitted radiation along a lateral direction.

In the illustrated embodiment, the formation of the reflector layers 602 and 606 is carried out by depositing a set of dielectric materials using ALD or another suitable deposition technique. In particular, each of the reflector layers 602 and 606 is implemented as a dielectric stack, including multiple dielectric layers and with the number of dielectric layers in the range of 2 to 1,000, such as in the range of 2 to 100, in the range of 30 to 80, or in the range of 30 to 80. Each individual dielectric layer can have a thickness in the range of about 1 nm to about 200 nm, such as from about 10 nm to about 150 nm or from about 10 nm to about 100 μm. Depending upon the number of dielectric layers forming the reflector layers 602 and 606, a total thickness of each of the reflector layers 602 and 606 can be in the range of about 100 nm to about 20 μm, such as from about 1 μm to about 15 μm or from about 1 μm to about 10 μm. For certain implementations, a dielectric stack can include multiple layers formed from different dielectric materials. Layers formed from different materials can be arranged in a periodic fashion, such as in an alternating fashion, or in a non-periodic fashion. Examples of dielectric materials that can be used to form the reflector layers 602 and 606 include oxides, such as silica, alumina, $TiO_2$, $Ta_2O_5$, $Nb_2O_5$, $ZrO_2$, $HfO_2$, $SnO_2$, $ZnO_2$, $La_2O_3$, $Y_2O_3$, $CeO_2$, $Sc_2O_3$, $Er_2O_3$, $V_2O_5$, and $In_2O_3$; nitrides, such as $SiO_xN_{2-x}$; fluorides, such as $CaF_2$, $SrF_2$, $ZnF_2$, $MgF_2$, $LaF_3$, and $GdF_2$; nanolaminates, such as $HfO_2/Ta_2O_5$, $TiO_2/Ta_2O_5$, $TiO_2/Al_2O_3$, $ZnS/Al_2O_3$, and AlTiO; and other suitable thin-film dielectric materials. Desirably, different materials forming a dielectric stack have different refractive indices so as to form a set of high index layers and a set of low index layers that are interspersed within the dielectric stack. For certain implementations, an index contrast in the range of about 0.3 to about 1 or in the range of about 0.3 to about 2 can be desirable. For example, $TiO_2$ and $SiO_2$ can be included in alternating layers of a dielectric stack to provide a relatively large index contrast between the layers. A larger index contrast can yield a larger stop band with respect to emitted radiation, thereby approaching the performance of an ideal omnireflector. In addition, a larger index contrast can yield a greater angular tolerance for reflectivity with respect to incident solar radiation, and can reduce a leakage of emitted radiation at larger angles from a normal direction.

The assembly of layers illustrated in FIG. 6 is then subjected to annealing to promote bonding between the layers as well as to promote reaction according to formula (48), thereby converting the precursor layer 604 to an emission layer that is sandwiched between the reflector layers 602 and 606.

Figure 7:
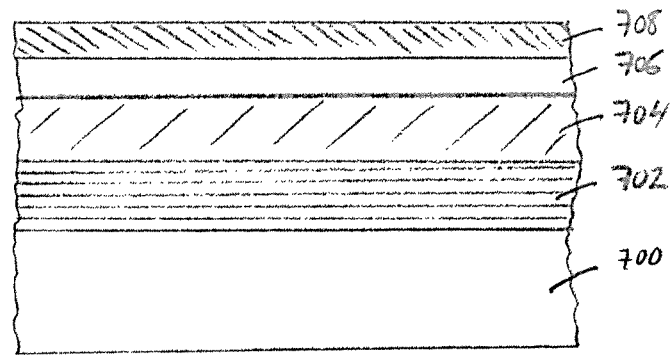

Referring next to FIG. 7, a reflector layer 702 is formed adjacent to a substrate 700, and a precursor layer 704 is formed adjacent to the reflector layer 702. Certain aspects of the manufacturing method of FIG. 7 can be implemented in a similar manner as described above for FIG. 5 and FIG. 6, and, therefore, are not further described herein.

As illustrated in FIG. 7, a spacer layer 706 is next formed adjacent to the precursor layer 704, followed by formation of another reflector layer 708 adjacent to the spacer layer 706. The spacer layer 706 and the reflector layer 708 serve to provide protection and sealing of a resulting luminescent material and to reduce its exposure to oxygen, humidity, and other contaminants. In addition, the reflector layer 708 serves to reduce loss of emitted radiation and to promote guiding of the emitted radiation along a lateral direction, while the spacer layer 706 provides index matching for low loss guiding of the emitted radiation. It is contemplated that the relative positions of the reflector layer 702 and the reflector layer 708, with respect to the precursor layer 704, can be switched for other implementations, and that the spacer layer 706 (or another similar spacer layer) and the reflector layer 708 (or another similar reflector layer) can be formed adjacent to the substrate 700, with the spacer layer 706 (or another similar spacer layer) providing a deposition surface for the formation of the precursor layer 704.

In the illustrated embodiment, the formation of the spacer layer 706 and the reflector layer 708 is carried out by depositing a set of materials using vacuum deposition or another suitable deposition technique. In particular, the reflector layer 708 is implemented so as to be omnireflective over a relatively wide range of wavelengths, and can be formed by depositing a metal, such as silver, aluminum, gold, copper, iron, cobalt, nickel, palladium, platinum, ruthenium, or iridium; a metal alloy; or another suitable material having broadband reflectivity. A thickness of the reflector layer 708 can be in the range of about 1 nm to about 200 nm, such as from about 10 nm to about 150 nm or from about 10 nm to about 100 μm. As illustrated in FIG. 7, the spacer layer 706 can be formed by depositing a suitable low index material, such one having a refractive index that is no greater than about 2, no greater than about 1.5, or no greater than about 1.4. Examples of suitable low index materials include $MgF_2$ (refractive index of about 1.37), $CaF_2$, silica, alumina, and other suitable thin-film, low index, dielectric materials. A thickness of the spacer layer 706 can be in the range of about 1 nm to about 500 nm, such as from about 50 nm to about 300 nm or from about 10 nm to about 100 nm.

The assembly of layers illustrated in FIG. 7 is then subjected to annealing to promote bonding between the layers as well as to promote reaction according to formula (48), thereby converting the precursor layer 704 to an emission layer that is sandwiched between the reflector layers 702 and 708.

Figure 8:
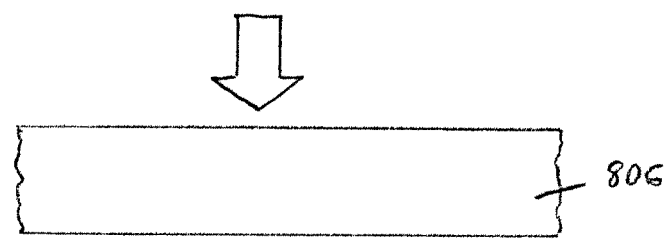
Figure 8:
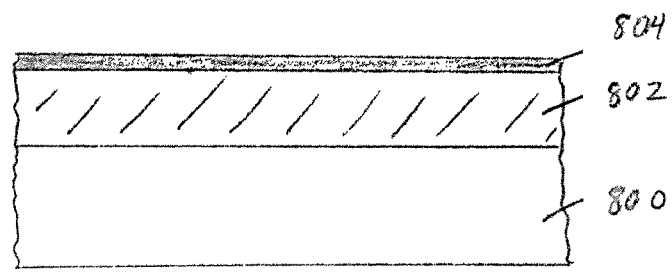

Referring next to FIG. 8, a bottom substrate 800 is provided, and a precursor layer 802 is formed adjacent to the bottom substrate 800. While not illustrated in FIG. 8, it is contemplated that either, or both, a spacer layer and a reflector layer can be formed adjacent to the bottom substrate 800 and can provide a deposition surface for the formation of the precursor layer 802. Certain aspects of the manufacturing method of FIG. 8 can be implemented in a similar manner as described above for FIG. 5 through FIG. 7, and, therefore, are not further described herein.

As illustrated in FIG. 8, a bonding layer 804 is next formed adjacent to the precursor layer 802, followed by positioning of a top substrate 806 adjacent to the bonding layer 804, and followed by bonding and annealing of the assembly of layers. The bonding layer 804 and the top substrate 806 serve to provide protection and sealing of a resulting luminescent material and to reduce its exposure to oxygen, humidity, and other contaminants. It is contemplated that the bonding layer 804 (or another similar bonding layer) can be formed adjacent to the top substrate 806, and then positioned adjacent to the precursor layer 802 to achieve bonding.

In the illustrated embodiment, the formation of the bonding layer 804 is carried out by depositing an adhesive or bonding material using any suitable deposition technique. In particular, the bonding layer 804 can be formed by depositing a thermal-curable adhesive or bonding material, such as a glass (e.g., a spin-on glass or a sealing glass) or a polymer (e.g., a perfluoropolymer or an epoxy-based polymer). A thickness of the bonding layer 804 can be in the range of about 1 nm to about 200 nm, such as from about 10 nm to about 150 nm or from about 10 nm to about 100 μm.

Bonding can be achieved using fluid pressure, a mechanical press, or another suitable bonding technique, along with the application of thermal energy to promote bonding as well as to promote reaction according to formula (48). It is also contemplated that bonding can be achieved using an ultraviolet light-curable adhesive or bonding material, rather than a thermal-curable adhesive or bonding material. For example, a thin coating of a pre-polymer (or a set of monomers) can be applied to a set of surfaces, and, after the surfaces are pressed together, ultraviolet light exposure can be applied through either, or both, of the surfaces to cure the pre-polymer (or the monomers).

Solar Modules

Figure 9:
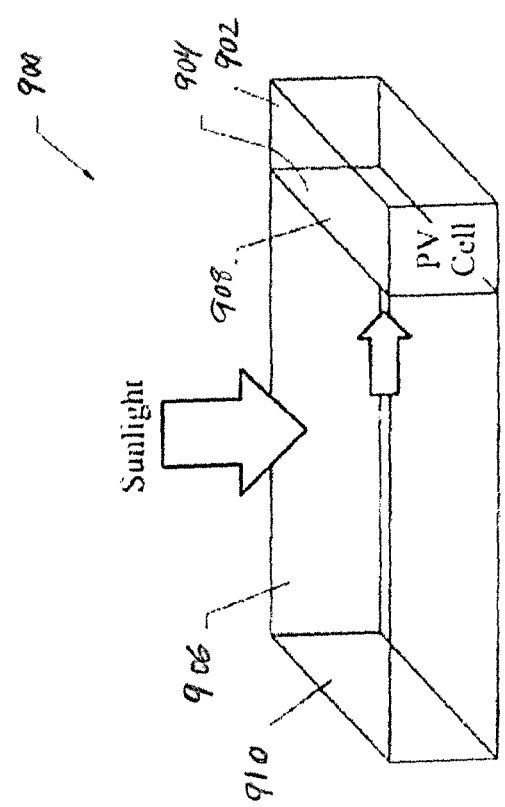
FIG. 9 illustrates a solar module implemented in accordance with an embodiment of the invention.

FIG. 9 illustrates a solar module 900 implemented in accordance with an embodiment of the invention. The solar module 900 includes a PV cell 902, which is a p-n junction device formed from crystalline silicon. However, the PV cell 902 can also be formed from another suitable photoactive material. As illustrated in FIG. 9, the PV cell 902 is implemented as a thin slice or strip of crystalline silicon. The use of thin slices of silicon allows a reduction in silicon consumption, which, in turn, allows a reduction in manufacturing costs. Micromachining operations can be performed on a silicon wafer to form numerous silicon slices, and each of the silicon slices can be further processed to form PV cells, such as the PV cell 902. As illustrated in FIG. 9, the PV cell 902 is configured to accept and absorb radiation incident upon a side surface 904 of the PV cell 902, although other surfaces of the PV cell 902 can also be involved.

In the illustrated embodiment, the solar module 900 also includes a spectral concentrator 906, which is formed as a slab having a side surface 908 that is adjacent to the side surface 904 of the PV cell 902. The spectral concentrator 906 includes a set of luminescent materials as described herein, which can be included within an emission layer to convert a relatively wide range of energies of solar radiation into a relatively narrow, substantially monochromatic energy band that is matched to an absorption spectrum of the PV cell 902. During operation of the solar module 900, incident solar radiation strikes a top surface 910 of the spectral concentrator 906, and a certain fraction of this incident solar radiation penetrates below the top surface 910 and is absorbed and converted into substantially monochromatic, emitted radiation. This emitted radiation is guided laterally within the spectral concentrator 906, and a certain fraction of this emitted radiation reaches the side surface 904 of the PV cell 902, which absorbs and converts this emitted radiation into electricity.

In effect, the spectral concentrator 906 performs a set of operations, including: (1) collecting incident solar radiation; (2) converting the incident solar radiation into substantially monochromatic, emitted radiation near a bandgap energy of the PV cell 902; and (3) conveying the emitted radiation to the PV cell 902, where the emitted radiation can be converted to useful electrical energy. The spectral concentrator 906 can include distinct structures that are optimized or otherwise tailored towards respective ones of the collection, conversion, and conveyance operations. Alternatively, certain of these operations can be implemented within a common structure. These operations that are performed by the spectral concentrator 906 are further described below.

Collection refers to capturing or intercepting incident solar radiation in preparation for conversion to emitted radiation.

Collection efficiency of the spectral concentrator 906 can depend upon the amount and distribution of a luminescent material within the spectral concentrator 906. In some instances, the luminescent material can be viewed as a set of luminescent centers that can intercept incident solar radiation, and a greater number of luminescent centers typically increases the collection efficiency. Depending upon the distribution of the luminescent centers, collection of incident solar radiation can occur in a distributed fashion throughout the spectral concentrator 906, or can occur within one or more regions of the spectral concentrator 906. The collection efficiency can also depend upon other aspects of the spectral concentrator 906, including the ability of incident solar radiation to reach the luminescent material. In particular, the collection efficiency is typically improved by suitable optical coupling of incident solar radiation to the luminescent material, such as via an anti-reflection coating to reduce reflection of incident solar radiation.

Conversion refers to emitting radiation in response to incident solar radiation, and the efficiency of such conversion refers to the probability that an absorbed solar photon is converted into an emitted photon. Conversion efficiency of the spectral concentrator 906 can depend upon photoluminescence characteristics of a luminescent material, including its optical quantum efficiency or its internal quantum efficiency, but can also depend upon interaction of luminescent centers with their local optical environment, including via resonant cavity effects. Depending upon the distribution of the luminescent centers, conversion of incident solar radiation can occur in a distributed fashion throughout the spectral concentrator 906, or can occur within one or more regions of the spectral concentrator 906. Also, depending upon the particular luminescent material used, the conversion efficiency can depend upon wavelengths of incident solar radiation that are absorbed by the luminescent material.

Conveyance refers to guiding or propagation of emitted radiation towards the PV cell 902, and the efficiency of such conveyance refers to the probability that an emitted photon reaches the PV cell 902. Conveyance efficiency of the spectral concentrator 906 can depend upon photoluminescence characteristics of a luminescent material, including a degree of overlap between emission and absorption spectra, but can also depend upon interaction of luminescent centers with their local optical environment, including via resonant cavity effects.

By performing these operations, the spectral concentrator 906 provides a number of benefits. In particular, by performing the collection operation in place of the PV cell 902, the spectral concentrator 906 allows a significant reduction in silicon consumption, which, in turn, allows a significant reduction in manufacturing costs. In some instances, the amount of silicon consumption can be reduced by a factor of about 10 to about 1,000. Also, the spectral concentrator 906 enhances solar energy conversion efficiency based on at least two effects: (1) concentration effect; and (2) monochromatic effect.

In terms of the concentration effect, the spectral concentrator 906 performs spectral concentration by converting a relatively wide range of energies of incident solar radiation into a narrow band of energies close to the bandgap energy of the PV cell 902. Incident solar radiation is collected via the top surface 910 of the spectral concentrator 906, and emitted radiation is guided towards the side surface 904 of the PV cell 902. A solar radiation collection area, as represented by, for example, an area of the top surface 910 of the spectral concentrator 906, can be significantly greater than an area of the PV cell 902, as represented by, for example, an area of the side surface 904 of the PV cell 902. A resulting concentration factor onto the PV cell 902 can be in the range of about 10 to about 100 and up to about 1,000 or more. For example, the concentration factor can exceed about 10,000 and can be up to about 60,000 or more. In turn, the concentration factor can increase the open circuit voltage or $V_{oc}$ of the solar module 900, and can yield an increase in solar energy conversion efficiency of about 2 percent (absolute), or 10 percent (relative), for each concentration factor of 10 in emitted radiation reaching the PV cell 902. For example, $V_{oc}$ can be increased from a typical value of about 0.55 V, which is about half the bandgap energy of silicon, to about 1.6 V, which is about 1.5 times the bandgap energy of silicon. A typical solar radiation energy flux or intensity is about 100 mW cm$^{-2}$, and, in some instances, a concentration factor of up to $10^6$ (or more) can be achieved by optimizing the spectral concentrator 906 with respect to the collection, conversion, and conveyance operations.

In terms of the monochromatic effect, the narrow band radiation emitted from the spectral concentrator 906 can be efficiently absorbed by the PV cell 902, which can be optimized in terms of its junction design to operate on this narrow band, emitted radiation. In addition, by matching the energy of the emitted radiation with the bandgap energy of the PV cell 902, thermalization can mostly occur within the spectral concentrator 906, rather than within the PV cell 902.

Aspects of Cavity Quantum Electrodynamics can be used to implement the spectral concentrator 906 as a micro-cavity or a resonant cavity waveguide. The resulting resonant cavity effects can provide a number of benefits. For example, resonant cavity effects can be exploited to control a direction of emitted radiation towards the PV cell 902 and, therefore, enhance the fraction of emitted radiation reaching the PV cell 902. This directional control can involve suppressing emission for optical modes in non-guided directions, while allowing or enhancing emission for optical modes in guided directions towards the PV cell 902. In such manner, there can be a significant reduction in loss of emitted radiation via a loss cone. Also, resonant cavity effects can be exploited to modify emission characteristics, such as by enhancing emission of a set of wavelengths that are associated with certain optical modes and suppressing emission of another set of wavelengths that are associated with other optical modes. This modification of emission characteristics can reduce an overlap between an emission spectrum and an absorption spectrum via spectral pulling, and can reduce losses arising from self-absorption. This modification of emission characteristics can also yield a larger exciton binding energy, and can promote luminescence via exciton emission. In addition, resonant cavity effects can enhance absorption and emission characteristics of a set of luminescent materials, and can allow the use of semiconductor materials having indirect optical transitions or forbidden optical transitions. This enhancement of absorption and emission characteristics can involve optical gain as well as amplified spontaneous emission, such as via the Purcell effect. In some instances, the high intensity of emitted radiation within the spectral concentrator 906 can lead to stimulated emission and lasing, which can further reduce losses as emitted radiation is guided towards the PV cell 902.

In the illustrated embodiment, a local density of optical states within the spectral concentrator 906 can include both guided optical modes and radiative optical modes. Guided optical modes can involve propagation of emitted radiation along the spectral concentrator 906, while radiative optical modes can involve propagation of emitted radiation out of the spectral concentrator 906. For a relatively low degree of vertical confinement, the local density of optical states and emission characteristics are modified to a relatively low degree. Increasing vertical confinement, such as by increasing an index contrast between dielectric layers of a dielectric stack, can introduce greater distortions in the local density of optical states, yielding modification of emission characteristics including directional control. Also, by adjusting a thickness of an emission layer within the spectral concentrator 906 with respect to vertical resonance, radiative optical modes can be suppressed. This suppression can reduce emission losses out of the spectral concentrator 906, while enhancing probability of lateral emission along the spectral concentrator 906 in a direction towards the PV cell 902. For certain implementations, the emission layer can be disposed between a pair of reflector layers so as to be substantially centered at an anti-node position of a resonant electromagnetic wave, and the pair of reflector layers can be spaced to yield a cavity length in the range of a fraction of a wavelength to about ten wavelengths or more. Lateral confinement can also be achieved by, for example, forming reflector layers adjacent to side edges and surfaces of the spectral concentrator 906, which are not involved in conveyance of radiation.

When implemented as a resonant cavity waveguide, a performance of the spectral concentrator 906 can be characterized with reference to its quality or Q value, which can vary from low to high. A relatively low Q value can be sufficient to yield improvements in efficiency, with a greater Q value yielding additional improvements in efficiency. For certain implementations, the spectral concentrator 906 can have a Q value that is at least about 5, such as at least about 10 or at least about 100, and up to about $10^5$ or more, such as up to about 10,000 or up to about 1,000. In the case of a high-Q resonant cavity waveguide, the spectral concentrator 906 can exhibit an exciton emission in which excitons interact with cavity photons to form coupled exciton-photon quasi-particles referred as exciton-polaritons. The spectral concentrator 906 can operate in a weak coupling regime or a strong coupling regime, depending upon an extent of coupling between excitons and cavity photons or among excitons in the case of bi-excitons.

In the strong coupling regime, the spectral concentrator 906 can be implemented as a polariton laser, which can lead to highly efficient and intense emissions and extremely low lasing thresholds. A polariton laser can have substantially zero losses and an efficiency up to about 100 percent. A polariton laser is also sometimes referred as a zero threshold laser, in which there is little or no lasing threshold, and lasing derives at least partly from excitons or related quasi-particles, such as bi-excitons or exciton-polaritons. The formation of quasi-particles and a resulting modification of energy levels or states can reduce losses arising from self-absorption. Contrary to conventional lasers, a polariton laser can emit coherent and substantially monochromatic radiation without population inversion. Without being bound by a particular theory, emission characteristics of a polariton laser can occur when exciton-polaritons undergo Bose-condensation within a resonant cavity waveguide. Lasing can also occur in the weak coupling regime, although a lasing threshold can be higher than for the strong coupling regime. In the weak coupling regime, lasing can derive primarily from excitons, rather than from exciton-polaritons.

By implementing as a high-Q resonant cavity waveguide in the form of a polariton laser, the spectral concentrator 906 can exhibit a number of desirable characteristics. In particular, lasing can be achieved with a very low threshold, such as with an excitation intensity that is no greater than about 200 mW cm$^{-2}$, no greater than about 100 mW cm$^{-2}$, no greater than about 50 mW cm$^{-2}$, or no greater than about 10 mW cm$^{-2}$, and down to about 1 mW cm$^{-2}$ or less, which is several orders of magnitude smaller than for a conventional laser. Because a typical solar radiation intensity is about 100 mW cm$^2$, lasing can be achieved with normal sunlight with little or no concentration. Also, lasing can occur with a short radiative lifetime, such as no greater than about 500 psec, no greater than about 200 psec, no greater than about 100 psec, or no greater than about 50 psec, and down to about 1 psec or less, which can avoid or reduce relaxation through non-radiative mechanisms. Furthermore, lasing can involve narrowing of a spectral width of an emission spectrum to form a narrow emission line, such as by a factor of at least about 1.5, at least about 2, or at least about 5, and up to about 10 or more, relative to the case where there is a substantial absence of resonant cavity effects. For example, in the case of UD930, a spectral width can be narrowed to a value in the range of about 2 nm to about 10 nm, such as from about 3 nm to about 10 nm, when UD930 is incorporated in a high-Q resonant cavity waveguide. A narrow emission line from lasing can enhance solar conversion efficiencies, as a result of the monochromatic effect. In such manner, lasing and low loss with distance can allow higher intensities of emissions reaching the PV cell 902 and higher solar conversion efficiencies. There can be little or no measurable loss of emissions that are guided towards the PV cell 902. With lasing, a solar energy conversion efficiency can be up to about 30 percent or more, such as in the range of about 20 percent to about 30 percent or in the range of about 28 percent to about 30 percent.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation of Luminescent Material—UD930

Samples of UD930 were formed in a reproducible manner by vacuum deposition in accordance with two approaches. In accordance with one approach, tin(II) iodide and cesium(I) iodide were evaporated in sequential layers, typically up to six layers total. In accordance with another approach, tin(II) chloride and cesium(I) iodide were evaporated in sequential layers, typically up to six layers total. For certain samples, a thickness of the tin(II) chloride-containing layer was about 90 nm, and a thickness of the cesium(I) iodide-containing layer was about 170 nm. Tin(II) iodide (or tin(II) chloride) was deposited by thermal evaporation, while cesium(I) iodide was deposited by electron-beam evaporation. Deposition was carried out at a pressure of about 10$^{-5}$ Torr (or less) on a variety of substrates, including those formed from glass, ceramic, and silicon.

Figure 10:
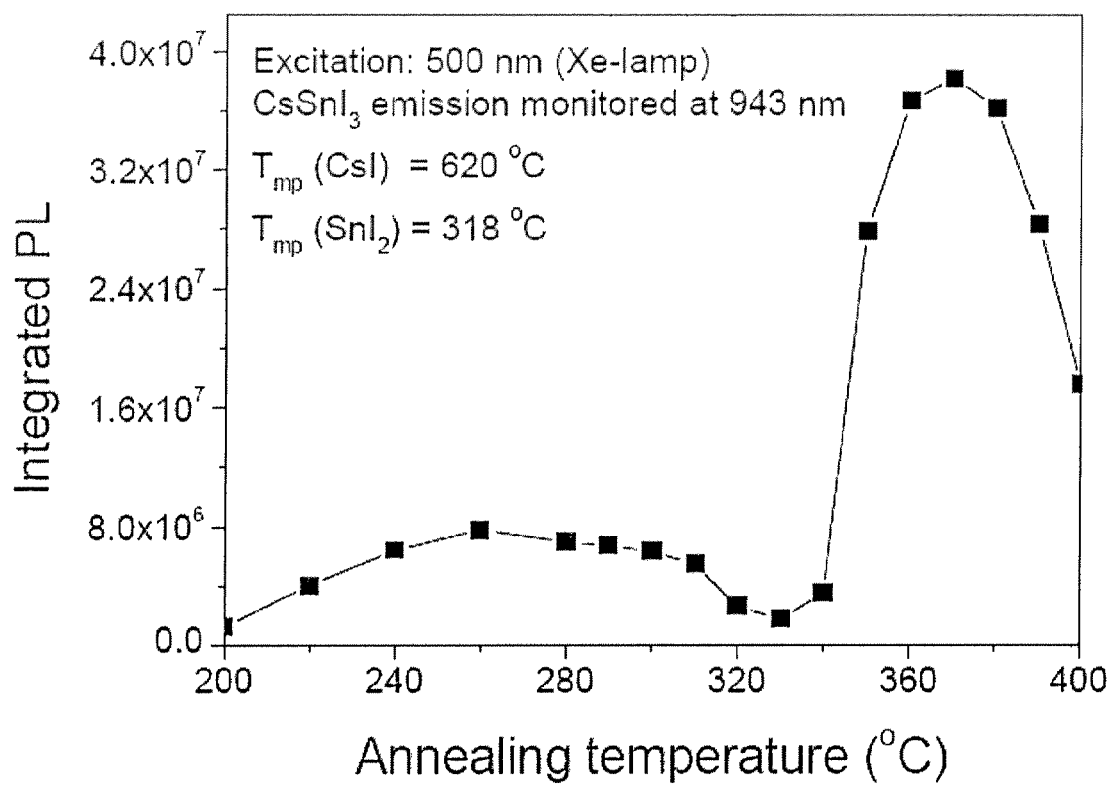
FIG. 10 illustrates measured photoluminescence intensity plotted as a function of annealing temperature for UD930, according to an embodiment of the invention.

Following deposition, resulting samples were annealed in a glove box in a dry, nitrogen atmosphere to allow a self-limiting chemical reaction between tin(II) iodide (or tin(II) chloride) and cesium(I) iodide. In the case of samples formed using tin(II) chloride, annealing was also sometimes carried out in air. An optimum annealing temperature was observed to vary somewhat depending upon a particular sample, but typically was greater than a melting point of tin(II) iodide at about 318° C. (or a melting point of tin(II) chloride at about 246° C.). FIG. 10 illustrates measured photoluminescence intensity at about 943 nm plotted as a function of annealing temperature for tin(II) iodide/cesium(I) iodide deposited on a silicon substrate (with native $SiO_2$), according to an embodiment of the invention. Annealing at temperatures at or below the melting point of tin(II) iodide was observed to yield weak photoluminescence intensity, while a strong band of photoluminescence intensities was observed after annealing at temperatures of about 50° C. above the melting point of tin(II) iodide. An optimum annealing time period was observed to vary somewhat depending upon a particular sample and a particular substrate used. In the case of samples formed on glass substrates, an optimal annealing time period typically was about 15 sec. Stability of photoluminescence was enhanced if the samples were stored in a dry, nitrogen atmosphere, or were encapsulated, such as by bonding to a glass substrate using a layer of epoxy.

Example 2

Characterization of Luminescent Material—UD930

Figure 11:
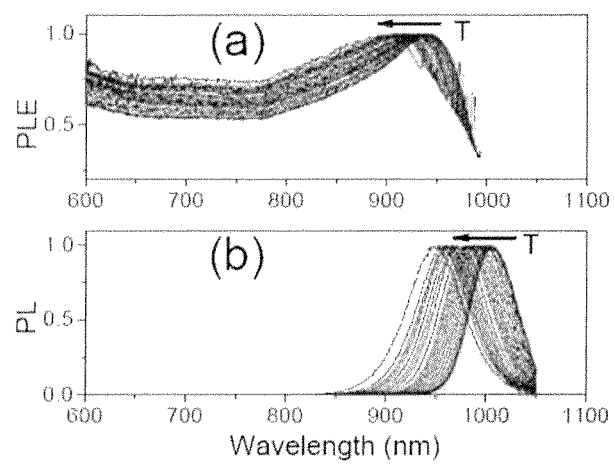
FIG. 11(a) illustrates excitation spectra for UD930 at temperatures in the range of 12K to 300K, according to an embodiment of the invention.
FIG. 11(b) illustrates emission spectra for UD930 at temperatures in the range of 12K to 300K, according to an embodiment of the invention.

FIG. 11(a) illustrates excitation spectra obtained for UD930 at temperatures in the range of 12K to 300K, and FIG. 11(b) illustrates emission spectra obtained for UD930 in the same temperature range, according to an embodiment of the invention. As can be appreciated, a variation of the peak positions with temperature is similar for the excitation and emission spectra.

A practitioner of ordinary skill in the art requires no additional explanation in developing the luminescent materials described herein but may nevertheless find some helpful guidance by examining the co-pending and co-owned U.S. patent application Ser. No. 11/689,381 (now U.S. Pat. No. 7,641,815), filed on Mar. 21, 2007, the disclosure of which is incorporated herein by reference in its entirety.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A luminescent material having the formula:

$$[A_a Sn_b X_x X'_{x'} X''_{x''}]$$

wherein
the luminescent material is polycrystalline;
A is included in the luminescent material as a monovalent cation;
X, X', and X" are selected from fluorine, chlorine, bromine, and iodine;
a is in the range of 1 to 5;
b is in the range of 1 to 3;
a sum of x, x', and x" is in the range of 1 to 5; and
at least X' is iodine, such that $x'/(x+x'+x'') \geq 1/5$,
wherein the luminescent material includes a dopant selected from at least one of $O^{-2}$ and $OH^{-1}$.

2. The luminescent material of claim 1, wherein A is selected from potassium, rubidium, and cesium.

3. The luminescent material of claim 1, wherein A is cesium, and a is 1 or 2.

4. The luminescent material of claim 1, wherein b is 1 or 2.

5. The luminescent material of claim 1, wherein at least one of X and X" is fluorine.

6. The luminescent material of claim 1, wherein at least one of X and X" is chlorine.

7. The luminescent material of claim 1, wherein at least one of X and X" is bromine.

8. The luminescent material of claim 1, wherein $x'/(x+x'+x'') \geq 1/2$.

9. The luminescent material of claim 1, wherein $x'/(x+x'+x'') \geq 2/3$.

10. The luminescent material of claim 1, wherein a is 1, and b is 1.

11. A luminescent material having the formula:

$$[A_a Sn_b X_x X'_{x'} X''_{x''}]$$

wherein
the luminescent material is polycrystalline;
A is included in the luminescent material as a monovalent cation;
X, X', and X" are selected from fluorine, chlorine, bromine, and iodine;
a is in the range of 1 to 5;
b is in the range of 1 to 3;
a sum of x, x', and x" is in the range of 1 to 5; and
at least X' is iodine, such that $x'/(x+x'+x'') \geq 1/5$, wherein a is 1, and b is 2.

12. The luminescent material of claim 1, wherein a is 2, and b is 1.

13. A luminescent material having the formula:

$$[A_a Sn_b X_x X'_{x'} X''_{x''}]$$

wherein
the luminescent material is polycrystalline;
A is included in the luminescent material as a monovalent cation;
X, X', and X" are selected from fluorine, chlorine, bromine, and iodine;
a is in the range of 1 to 5;
b is in the range of 1 to 3;
a sum of x, x', and x" is in the range of 1 to 5; and
at least X' is iodine, such that $x'/(x+x'+x'') \geq 1/5$, wherein the luminescent material includes a dopant selected from at least one of $NO_3^{-1}$, $SCN^{-1}$, $OCl^{-1}$, $SO_4^{-2}$, $PO_4^{-3}$, $PO_3^{-1}$, $C_2O_4^{-2}$, $CH_3SO_3^{-1}$, $CF_3SO_3^{-1}$, and $P_2O_7^{-4}$, and the dopant is included in the luminescent material in an amount less than 5 percent in terms of elemental composition.

14. The luminescent material of claim 13, wherein the dopant is included in the luminescent material in an amount in the range of 0.1 percent to 1 percent in terms of elemental composition.

15. The luminescent material of claim 1, wherein a is 1 or 2, b is 1 or 2, and the sum of x, x', and x" is substantially a+2b.

16. The luminescent material of claim 1, wherein the dopant is included in the luminescent material in an amount less than 5 percent in terms of elemental composition.

17. The luminescent material of claim 1, wherein the luminescent material includes crystallites having sizes in the sub-micron range.

18. The luminescent material of claim 17, wherein the crystallites have an average size less than 700 nm.

19. The luminescent material of claim 17, wherein the crystallites have an average size less than 500 nm.

20. The luminescent material of claim 1, wherein A is cesium, X is chlorine, X' is iodine, and X" is bromine.

21. The luminescent material of claim 1, wherein A is cesium, X is chlorine, X' is iodine, and X" is fluorine.

22. The luminescent material of claim 11, wherein A is selected from potassium, rubidium, and cesium.

23. The luminescent material of claim 11, wherein A is cesium.

24. The luminescent material of claim 11, wherein at least one of X and X" is fluorine.

25. The luminescent material of claim 11, wherein at least one of X and X" is chlorine.

26. The luminescent material of claim 11, wherein at least one of X and X" is bromine.

27. The luminescent material of claim 11, wherein $x'/(x+x'+x'') \geq 1/2$.

28. The luminescent material of claim 11, wherein $x'/(x+x'+x'') \geq 2/3$.

29. The luminescent material of claim 11, wherein the luminescent material includes crystallites having sizes in the sub-micron range.

30. The luminescent material of claim 13, wherein A is selected from potassium, rubidium, and cesium.

31. The luminescent material of claim 13, wherein A is cesium, and a is 1 or 2.

32. The luminescent material of claim 13, wherein b is 1 or 2.

33. The luminescent material of claim 13, wherein at least one of X and X" is fluorine.

34. The luminescent material of claim 13, wherein at least one of X and X" is chlorine.

35. The luminescent material of claim 13, wherein at least one of X and X" is bromine.

36. The luminescent material of claim 13, wherein $x'/(x+x'+x'') \geq 1/2$.

37. The luminescent material of claim 13, wherein $x'/(x+x'+x'') \geq 2/3$.

38. The luminescent material of claim 13, wherein a is 1, and b is 1.

39. The luminescent material of claim 13, wherein the luminescent material includes crystallites having sizes in the sub-micron range.

* * * * *